United States Patent
Bahr et al.

(10) Patent No.: US 10,312,185 B2
(45) Date of Patent: Jun. 4, 2019

(54) INDUCTIVELY COUPLED MICROELECTROMECHANICAL SYSTEM RESONATOR

(71) Applicant: Texas Instruments Incorporated, Dallas, TX (US)

(72) Inventors: Bichoy Bahr, Richardson, TX (US); Baher Haroun, Allen, TX (US); Ali Kiaei, San Jose, CA (US)

(73) Assignee: TEXAS INSTRUMENT INCORPORATED, Dallas, TX (US)

( * ) Notice: Subject to any disclaimer, the term of this patent is extended or adjusted under 35 U.S.C. 154(b) by 30 days.

(21) Appl. No.: 15/726,284

(22) Filed: Oct. 5, 2017

(65) Prior Publication Data

US 2019/0109075 A1    Apr. 11, 2019

(51) Int. Cl.
| | | |
|---|---|---|
| H01L 23/495 | (2006.01) | |
| B81C 1/00 | (2006.01) | |
| G01C 19/56 | (2012.01) | |
| H01L 23/00 | (2006.01) | |
| B81B 7/02 | (2006.01) | |
| B81B 7/00 | (2006.01) | |

(52) U.S. Cl.
CPC ...... *H01L 23/49541* (2013.01); *B81B 7/0048* (2013.01); *B81B 7/02* (2013.01); *B81C 1/0023* (2013.01); *G01C 19/56* (2013.01); *H01L 23/49503* (2013.01); *H01L 23/49575* (2013.01); *H01L 24/48* (2013.01)

(58) Field of Classification Search
None
See application file for complete search history.

(56) References Cited

U.S. PATENT DOCUMENTS

| | | |
|---|---|---|
| 5,422,605 A | 6/1995 | Yang et al. |
| 6,885,275 B1 | 4/2005 | Chang |
| 6,995,622 B2 | 2/2006 | Partridge et al. |
| 7,671,710 B2 | 3/2010 | Yoshida et al. |
| 7,804,374 B1 | 9/2010 | Brown et al. |
| 7,812,683 B2 | 10/2010 | Sutardja |
| 8,648,663 B2 | 2/2014 | Yajima |

(Continued)

FOREIGN PATENT DOCUMENTS

| | | |
|---|---|---|
| SU | 1076963 A1 | 2/1984 |
| WO | 2015176041 A1 | 11/2015 |

OTHER PUBLICATIONS

Christina F. Jou, Kuo-Hua Cheng, and Hsien-Cheng Hsieh, "An Ultra-Low Power 2.4GHz CMOS VCO", Proceedings of the 2003 10th IEEE International Conference on Electronics, Circuits and Systems, 2003, Dec. 14-17, 2003, Sharjah, United Arab Emirates, pp. 1098-1100.

(Continued)

Primary Examiner — Lex H Malsawma
(74) Attorney, Agent, or Firm — Michael A. Davis, Jr.; Charles A. Brill; Frank D. Cimino

(57) ABSTRACT

An integrated circuit package includes a first die that has a microelectromechanical system (MEMS) resonator coupled to a coil. A second die includes a coil fabricated on a top surface of the second die, and an electronic circuit with tank circuit terminals fabricated on the second die and coupled to the second coil. The second die is positioned adjacent the first die such that the first coil is operable to electromagnetically couple to the second coil.

20 Claims, 18 Drawing Sheets

(56) References Cited

U.S. PATENT DOCUMENTS

| | | | |
|---|---|---|---|
| 10,177,742 B2 | 1/2019 | Nguyen et al. | |
| 2007/0290364 A1* | 12/2007 | Gupta | B81C 1/00341 257/777 |
| 2011/0003422 A1* | 1/2011 | Katragadda | B81C 1/0023 438/51 |
| 2012/0068776 A1* | 3/2012 | Asamura | H03B 5/30 331/74 |
| 2013/0107677 A1 | 5/2013 | Willemin et al. | |
| 2014/0374890 A1* | 12/2014 | Yamashita | H01L 23/49575 257/670 |
| 2015/0171934 A1* | 6/2015 | Brauchler | H01L 29/7393 455/41.1 |
| 2016/0027732 A1* | 1/2016 | Igarashi | H01L 24/49 257/531 |

OTHER PUBLICATIONS

R. M. da Ponte and F. R. Sousa, "Ultra-low-power 2.4 GHz Hartley Oscillator", Florianopolis, Brazil, 2012, pp. 1-4.

Dang Hua et al, "A Compensated Technique for 2.5-GHz Ring-Oscillator-Based PLL used in Wireless Transmission", 2013 IEEE International Conference on Green Computing and Communications and IEEE Internet of Things and IEEE Cyber, Physical and Social Computing, Aug. 20-23, 2013, Beijing, China, pp. 1795-1799.

Zhiheng Cao, Yunchu Li, and Shouli Yan, "A 0.4 ps-RMS-Jitter 1-3 GHz Ring-Oscillator PLL Using Phase—Noise Preamplitication", IEEE Journal of Solid-State Circuits, vol. 43, No. 9, Sep. 2008, pp. 2079-2089.

Markis Grozing, Bernd Phillip, and Manfred Berroth, "CMOS Ring Oscillator with Quadrature Outputs and 100 MHz to 3.5 GHz Tuning Range", Proceedings of the 29th European Solid-State Circuits Conference, 2003, ESSCIRC '03, Sep. 16-18, 2003, Estoril, Portugal, Portugal, pp. 679-682.

Wei-Wei Cheng et al, "A Low Power, Low Phase Noise FBAR Oscillator", Integrated Ferroelecrics, vol. 105, Issue 1_2009, pp. 75-86.

Arun Paidimarri et al, "A 0.68V 0.68mW 2.4GHz PLL for Ultra-low Power RF Systems", I2015 IEEE Radio Frequency Integrated Circuits Symposium (RFIC), May 17-19, 2015, Phoenix, AZ, pp. 1-4.

Jabeom Koo et al, "A-173 dBc/Hz @ 1 MHz offset Colpitts Oscillator using AlN Contour-Mode MEMS Resonator", 2013 IEEE Custom Integrated Circuits Conference (CICC), Sep. 22-25, 2013, San Jose, CA, pp 1-4.

Andrew Nelson et al, "A 22uW, 2.0GHz FBAR Oscillator", 2011 IEEE Radio Frequency Integrated Circuits Symposium (RFIC), Jun. 5-7, 2011, Baltimore, MD, pp. 1-4.

Kannan A. Sankaragomathi et al, "25.9 A +-3ppm 1.1mW FBAR Frequency Reference with 750MHz Output and 750mV Supply", 2015 IEEE International Solid-State Circuits Conference— (ISSCC), Feb. 22-26, 2015, San Francisco, CA, pp. 1-3.

Bichoy Bahr, Luca Daniel, and Dana Weinstein, "Optimization of Unreleased CMOS-MEMS RBTs", 2016 IEEE International Frequency Control Symposium (IFCS), May 9-12, 2016, New Orleans, LA, pp. 1-4.

Jinxxing Liang et al, "Flip Chip Bonding of a Quartz MEMS-Based Vibrating Beam Accelerometer", Sensors 2015 (9), Sep. 2, 2015, pp. 22049-22059.

Rodrigo Eduardo Rottava et al, "Ultra-low-power 2.4 GHz Colpitts Oscillator based on Double Feedback Technique", 2013 IEEE International Symposium on Circuits and Systems (ISCAS), May 19-23, 2013, Beijing, China, pp. 1785-1788.

Andreas C. Fischer et al, "Integrating MEMS and ICs", Microsystems & Nanoengineering 1, Article No. 15005 (2015), Received Mar. 3, 2015, Published May 28, 2015, pp. 1-16.

International Search Report for PCT/US2018/054508 dated Jan. 31, 2019.

International Search Report for PCT/US2018/054510 dated Jan. 31, 2019.

\* cited by examiner

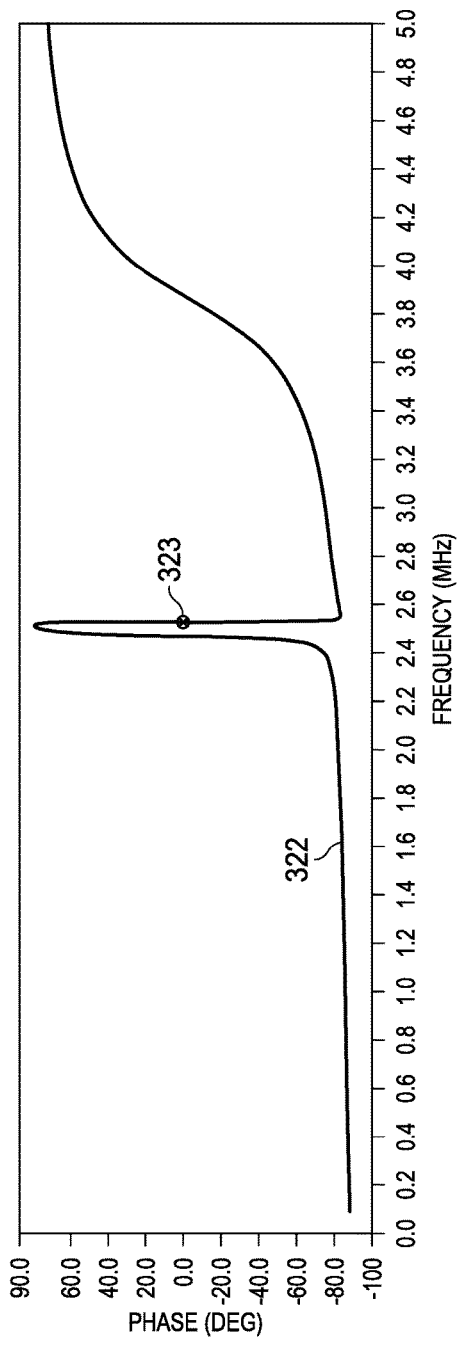
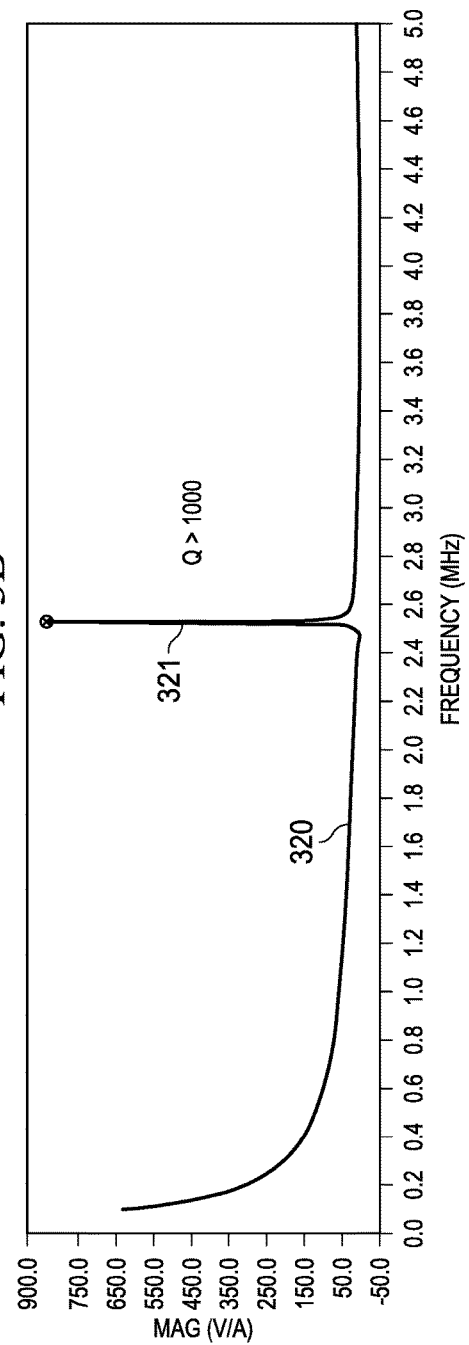

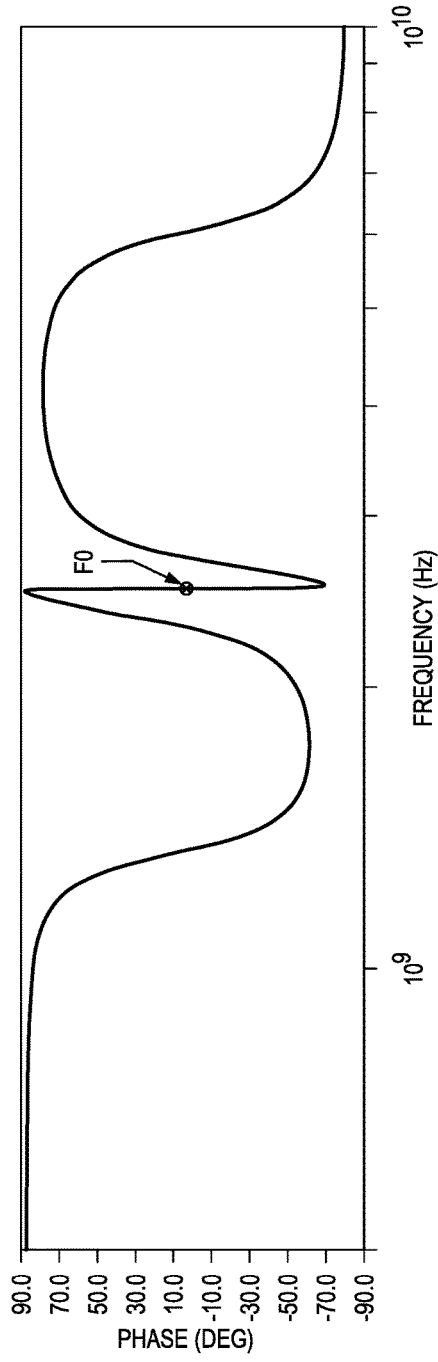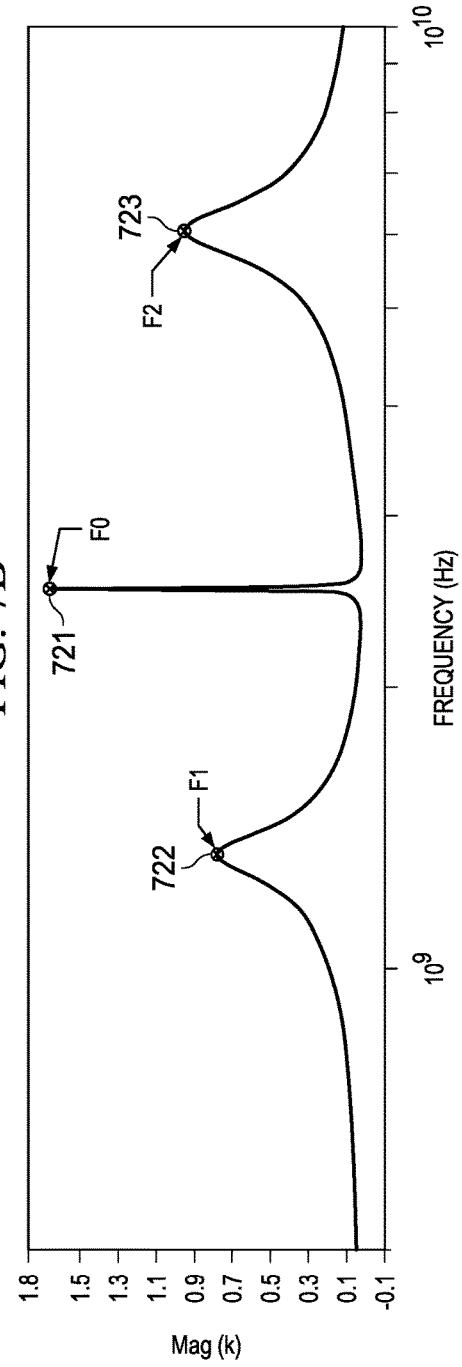

INDUCTIVELY COUPLED MICROELECTROMECHANICAL SYSTEM RESONATOR

FIELD OF THE DISCLOSURE

This disclosure relates an oscillator circuit that is inductively coupled to a micromechanical system resonator.

BACKGROUND OF THE DISCLOSURE

Microelectromechanical system (MEMS) resonators are used for multiple applications, among them low-power, low-phase noise, high stability oscillators. Connecting the MEMS resonators to the circuit as well as packaging are usually challenging aspects of such designs. Multiple approaches have been used, such as: wire-bonding, flip-chip MEMS, CMOS-MEMS, etc. Each approach includes a set of challenges that may limit its application to niche areas.

A thin-film bulk acoustic wave (BAW) resonator is a MEMS device that includes a piezoelectric material sandwiched between two electrodes and acoustically isolated from the surrounding medium. MEMS resonator devices using piezoelectric films with thicknesses ranging from several micrometers down to tenth of micrometers resonate in the frequency range of roughly 100 MHz to 10 GHz. Aluminum nitride and zinc oxide are two common piezoelectric materials used in MEMS resonators.

Several types of MEMS resonator based oscillators are known, see for example: Padimarri, Arun, Nathan Ickes, and Anantha P. Chandrakasan, "A 0.68V 0.68 mVV 2.4 GHz PLL for Ultra-Low Power RF Systems." 2015 IEEE Radio Frequency Integrated Circuits Symposium (RFIC) (May 2015); A. Nelson, J. Hu, J. Kaitila, R. Ruby and B. Otis, "A 22 µW, 2.0 GHz FBAR oscillator," 2011 *IEEE Radio Frequency Integrated Circuits Symposium*, Baltimore, Md., 2011, pp. 1-4. A high-Q MEMS-based oscillators may have moderate power consumption, low phase noise, and high accuracy/stability.

Other solutions to generate low power clocks in the GHz range include ring oscillators and LC (inductor-capacitor) oscillators. Ring oscillators usually produce relatively high power consumption in the milli-watt range (mW's), produce very high phase noise, and may have poor stability. LC oscillators also produce high power consumption (mW's), while providing moderate phase noise and poor stability. In some designs, power consumption may be reduced by reducing supply voltage or adjusting biasing of transistors in the oscillator circuit.

BRIEF DESCRIPTION OF THE DRAWINGS

Particular embodiments in accordance with the disclosure will now be described, by way of example only, and with reference to the accompanying drawings:

FIGS. 3A and 3B are plots illustrating impedance vs. frequency of the MEMS resonator of FIG. 1;

FIGS. 7A and 7B are plots illustrating impedance vs. frequency of the MEMS resonator and autotransformer of FIG. 6;

Figure 1:
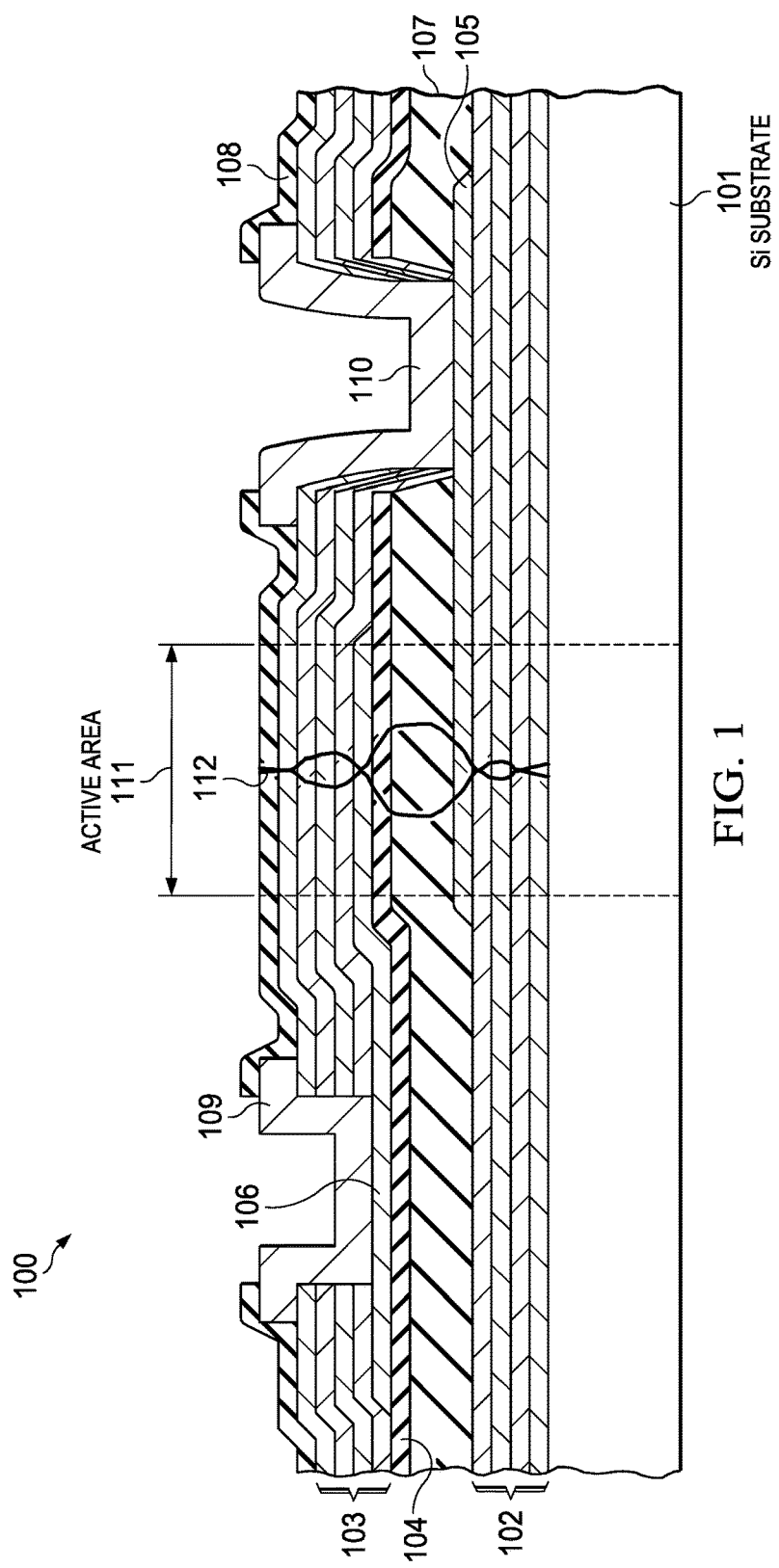
FIG. 1 is a cross section of an example solid MEMS resonator.

Other features of the present embodiments will be apparent from the accompanying drawings and from the detailed description that follows.

DETAILED DESCRIPTION OF EMBODIMENTS OF THE DISCLOSURE

Specific embodiments of the disclosure will now be described in detail with reference to the accompanying figures. Like elements in the various figures are denoted by like reference numerals for consistency. In the following detailed description of embodiments of the disclosure, numerous specific details are set forth in order to provide a more thorough understanding of the disclosure. However, it will be apparent to one of ordinary skill in the art that the disclosure may be practiced without these specific details. In other instances, well-known features have not been described in detail to avoid unnecessarily complicating the description.

For many applications, an ultra-low power, low-phase noise, high-stability clock is useful. An oscillator circuit that is coupled to a micromechanical system resonator via a transformer to increase the effective impedance of the resonator will be disclosed herein. Embodiments of the oscillator circuit may be used to produce multi-GHz clock signals with power consumption in the 100µW range. A transformer may be used to boost the impedance of a high-Q, high-stability MEMS resonator. The transformer may be an auto-transformer, such as a multi-tap inductor, which may be fabricated on the MEMS die itself, on the CMOS oscillator die, or may be a standalone external component, for example. Increasing the effective impedance of the MEMS resonator reduces current consumption from the oscillator circuit to generate the same voltage swing. The resonance frequency of the oscillator circuit is still defined by the MEMS resonator, which maintains the same frequency stability and accuracy as a traditional MEMS resonator based oscillator, as long as the transformer is designed such that the primary and secondary resonance is sufficiently separate from the resonance point of the MEMS resonator, as will be explained in more detail below.

FIG. 1 is a cross section of an example solid MEMS resonator 100 that may be coupled to an oscillator circuit to produce multi-GHz clock signals. MEMS resonator 100 is a solidly mounted bulk acoustic wave resonator that does not have any air gaps. MEMS resonator 100 may be formed on a silicon substrate using known or later developed semiconductor processing techniques.

A multilayer bottom Bragg mirror 102 and top Bragg mirror 103 may be formed on substrate 101. A distributed Bragg reflector (DBR) is a structure formed from multiple layers of alternating materials with varying refractive index. Each layer boundary causes a partial reflection of a wave. For waves whose bulk wavelength is close to four times the thickness of the layers, the many reflections combine with constructive interference, and the layers act as a high-quality reflector.

A bottom electrode 105 and a top electrode 106 may be formed in contact with the adjacent Bragg mirrors 102, 103. In this example, electrodes 105, 106 are patterned from a layer of metal, such as Al, Mo, Cu, Au, etc. A piezoelectric layer 107 may be positioned between the top electrode 106 and the bottom electrode 105. Piezoelectric layer may be fabricated using various piezo materials, such as AlN, quartz, GaN, lithium nobate, etc. A temperature compensating layer 104 of oxide may be formed on top of piezoelectric layer 107. A protective overcoat layer 108 such as oxide, SiN, glass, etc. may be placed over top Brag mirror 103. Terminals 109, 110 may be in contact with upper electrode 106 and lower electrode 105 and thereby provide terminals for coupling MEMS resonator 100 to an oscillator circuit.

Mechanical energy may be confined and isolated within active area 111 as illustrated by plot lines 112 that represent a vibration magnitude within active area 111.

While MEMS resonator 100 is described herein is some detail, other embodiments of the techniques disclosed herein may be used with other types and configurations of MEMS resonators that are currently know or later developed.

Figure 2:
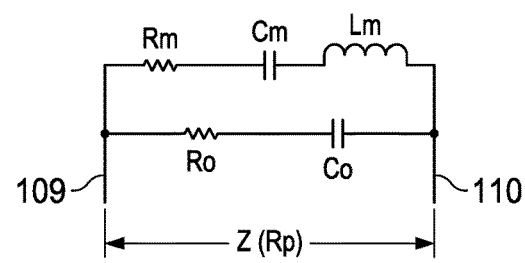
FIG. 2 is a schematic illustrating an equivalent circuit of the MEMS resonator of FIG. 1.

FIG. 2 is a MBVD (Modified Butterworth Van Dyke) equivalent circuit schematic illustrating an equivalent circuit of MEMS resonator 100 of FIG. 1. This example includes a static capacitor C0 and its loss R0, mechanically dynamic capacitor Cm, dynamic inductor Lm, and dynamic loss Rm. MEMS resonator 100 has two resonant frequencies at, the serial resonant frequency fs and the parallel resonant frequency fp. The Lm and Cm account for fs, whereas Lm, Cm, and C0 account for fp. An equivalent impedance (Z) is presented across terminals 109, 110.

FIGS. 3A and 3B are plots illustrating impedance vs. frequency of the MEMS resonator 100 of FIG. 1, as measured across terminals 109, 110. Plot line 320 illustrates effective impedance magnitude in volts/amps (V/A) vs. frequency in gigahertz (GHz), while plot line 322 illustrates phase shift in degrees (deg) vs. frequency in GHz. MEMS resonator 100 behaves like an inductor with high Q factor in a narrow frequency band between fs and fp, as indicated at 321 and 323. In this example, MEMS resonator 100 has an effective impedance of approximately 860 V/A and a 0 degree phase shift at 2.52 GHz with a Q factor greater than 1000. Thus, at resonance, MEMS resonator 100 reduces to a real resistance, that may be referred to as the parallel resistance, $R_p$, as indicated by expression (1). Away from the resonant point 321, MEMS resonator acts like a 2.5 pf capacitance.

$$R_p = Q\omega_0 L \quad (1)$$

Figure 4:
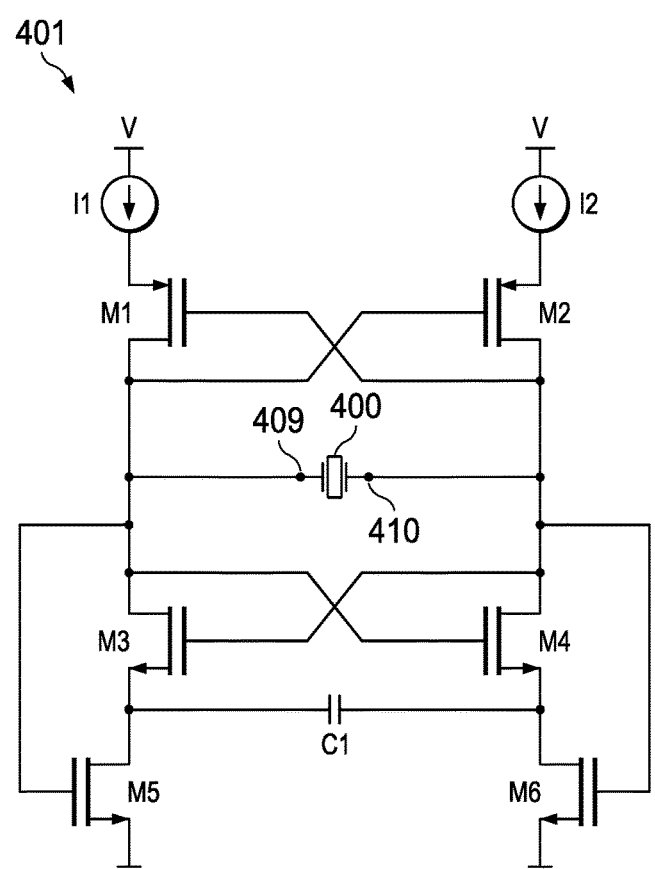
FIG. 4 is a schematic of a prior art oscillator using a MEMS resonator.

FIG. 4 is a schematic of a prior art oscillator circuit 401 that may use a MEMS resonator 400 that may be similar to MEMS resonator 100 as shown in FIG. 1. Oscillator circuit 401 may be implemented on a semiconductor substrate using complimentary metal-oxide semiconductor (CMOS) transistors, for example. In this example current sources I1, I2 provide a constant current to cross coupled differential pair PMOS transistors M1, M2 and cross coupled differential pair NMOS transistors M3, M4. MEMS resonator 400 acts as a tank circuit. NMOS transistors M5, M6, and capacitor C1 are needed to reduce gain at low frequencies. As mentioned above, MEMS resonator 400 may look like a capacitor at low frequency, but will look like an open circuit at DC (direct current) and the circuit might actually latch without the aid of transistors M5, M6.

MEMS resonator 400 may be implemented on a semiconductor substrate that is separate from the semiconductor substrate on which oscillator circuit 401 is fabricated. Typically, MEMS resonator 400 may be mounted on the CMOS oscillator chip. Bond wires may be used to connect MEMS resonator terminals 409, 410 to bond pads on the CMOS oscillator chip.

Figure 5:
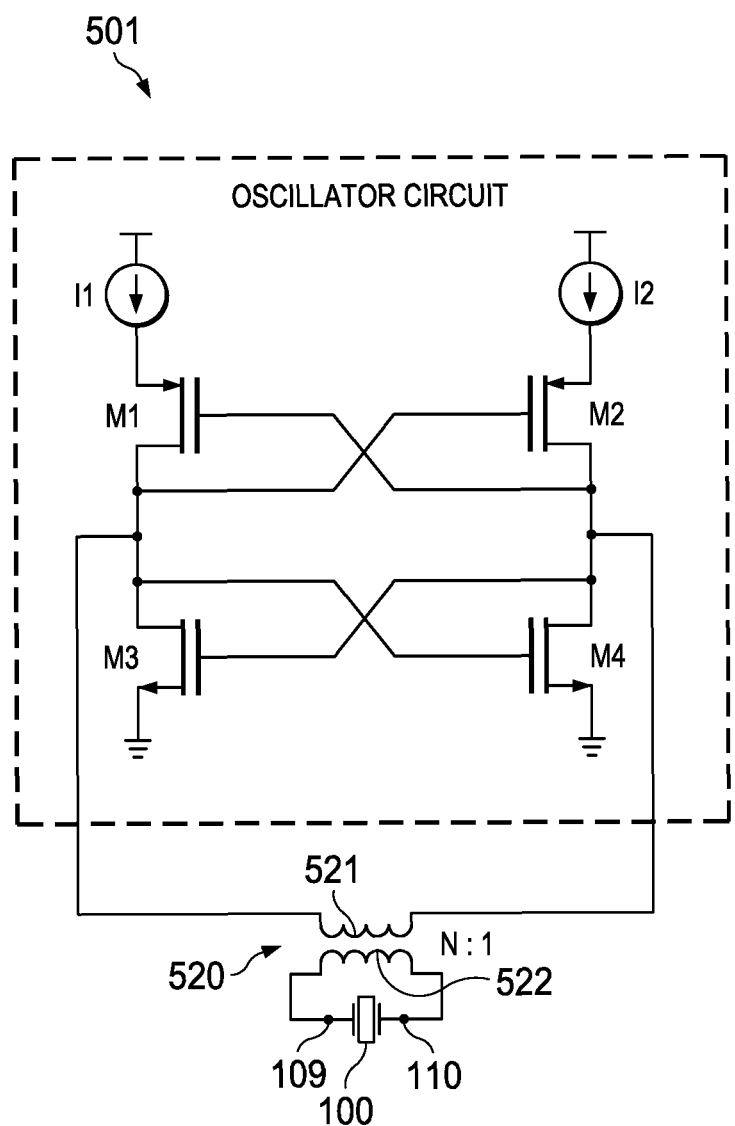
FIGS. 5-6 are schematics illustrating use of a transformer to step up the impedance of a MEMS resonator.
Figure 6:
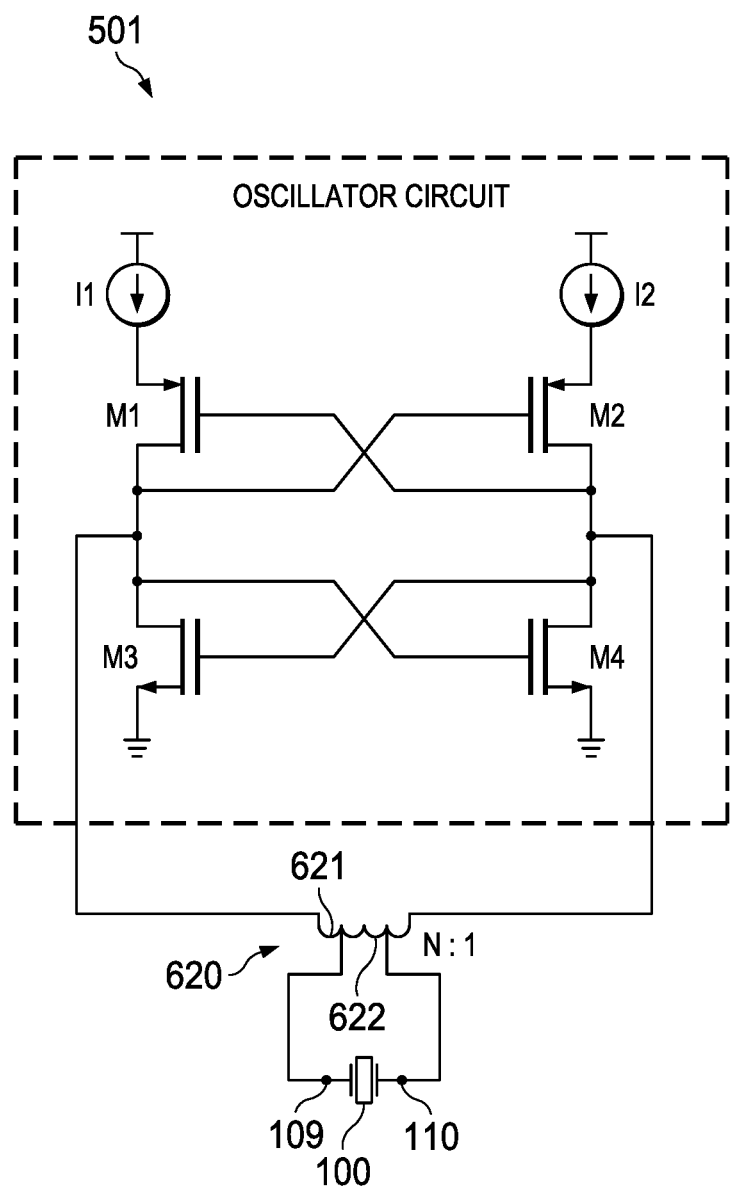

FIGS. 5-6 are schematics illustrating use of a transformer to step up the impedance of a MEMS resonator, such as MEMS resonator 100 as shown in FIG. 1. For both LC and MEMS-based oscillators, the active oscillator core circuit needs to supply enough energy in every oscillation cycle to replenish the losses in the resonator/tank circuit. This is the Barkhausen criterion for oscillation (oscillator loop gain magnitude=1, phase shift around the oscillator loop is $2n\pi$: $n \in \mathbb{N}$). In actual oscillator circuits, this usually defines a minimum gain, or transconductance ($g_m$) of the oscillator transistors, for the oscillation to be sustained. Transistors have a finite transconductance efficiency which may be expressed as $g_m/I_D$. A minimum supply current and hence power consumption is required for a given tank circuit or MEMS resonator to sustain oscillation. To satisfy Barkhausen criterion, $-g_m$ needs to overcome the tank losses, as indicated by expression (2). This minimum power consumption is inversely proportional to the tank/MEMS-resonator resistance $R_p$ at resonance.

$$g_m > \frac{1}{R_p} \quad (2)$$

Referring back to FIG. 3B, the impedance of example MEMS resonator 100 across terminals 108-110 at resonance is approximately 850 ohms. Since the phase shift is 0 at resonance, this impedance may also be referred to as a pure parallel resistance, $R_p$.

For power efficient oscillator operation in which a minimum possible phase noise is generated for the given amount of power consumption, it is desirable to commutate or switch as much of the oscillator supply current in the tank circuit or MEMS resonator, generating the largest possible voltage swing and having the transistors in the circuit acting like ideal switches. For fully-differential architectures, this implies commutating the full bias current between the positive and negative terminal of the tank circuit with a differential pair of transistors. Ideally, this provides very sharp current transitions. A minimum voltage is required for a differential-pair to fully switch its current between branches, as indicated by expression (3).

$$V_{min} = \sqrt{2}(V_{gs} - V_{th}) \quad (3)$$

This voltage swing requires a minimum amount of current switched into the tank resistance $R_p$ at resonance, which again sets a lower limit on the power consumption for the oscillator to be efficient. This lower limit may be higher than Brakhausen criterion limit. This lower limit is also inversely proportional to $R_p$.

For a given MEMS resonator available from a vendor, there is a lower limit on oscillator power consumption, below which the oscillator cannot start. Above this lower limit, the oscillator can have very low phase noise. In fact, some applications may tolerate higher phase noise in exchange for lower power consumption, but the lower power limit inherit to most oscillator structures prohibits such trade-off below a certain power level.

In various prior-art approaches, attempts have been made to co-design and co-optimize the MEMS resonator with the oscillator circuit to lower the power consumption. Typically, attempts are made to maximize $R_p$ of the MEMS resonator while having enough capacitance to avoid being significantly affected by the circuit parasitics. However, optimization of a MEMS resonator may require a lot of resources in terms of finite-element modeling as well as fabrication and testing.

A transformer or an auto-transformer may be used to boost $R_p$ of any MEMS resonator, hence enabling lower power consumption oscillators to be realized, even while using an "off-the-shelf" MEMS resonator. The transformer or auto-transformer may be fabricated on the MEMS die itself as part of the MEMS fabrication process, or may be an external component, for example.

Referring to FIG. 5, transformer 520 may be coupled between oscillator circuit 501 and MEMS resonator 100, as shown in more detail in FIG. 1. Transformer 520 may be implemented as a transformer with a turns ratio of N:1, where N may typically be less than approximately two, for example. In some embodiments, N may be higher than this example With a turns ratio of N=2, the impedance step-up may be approximately 4×. However, the Q factor of the transformer may limit the impedance step-up ratio. In this example, one of the coils 521 of the transformer may be connected to the oscillator and the other coil 522 may be connected to the MEMS resonator. Coil 521 may be referred to herein as the "primary coil" while coil 522 is referred to as the secondary coil.

Oscillator circuit 501 may be implemented on a semiconductor substrate using CMOS transistors, for example. In this example current sources 11, 12 provide a constant current to cross coupled differential pair PMOS transistors M1, M2 and cross coupled differential pair NMOS transistors M3, M4. MEMS resonator 100 acts as a tank circuit.

Referring to FIG. 6, autotransformer 620 may be coupled between oscillator circuit 501 and MEMS resonator 100, as shown in more detail in FIG. 1. Autotransformer 620 may be implemented as a transformer with a turns ratio of N:1, where N may typically be less than approximately two, for example. In some embodiments, N may be higher than this example. In this example, the entire coil 621 of autotransformer is the primary coil, while a portion 622 of the primary coil functions also as the secondary coil 622

Oscillator circuit 501 may be implemented on a semiconductor substrate using CMOS transistors, for example. In this example current sources 11, 12 provide a constant current to cross coupled differential pair PMOS transistors M1, M2 and cross coupled differential pair NMOS transistors M3, M4. MEMS resonator 100 acts as a tank circuit.

FIGS. 7A and 713 are plots illustrating impedance magnitude and phase vs. frequency of the MEMS resonator 100 and autotransformer 620 of FIG. 6. Similar plots may be produced for the MEMS resonator 100 and transformer 520 of FIG. 5. This disclosure provides a way to use an existing MEMS resonator to synthesize an oscillator with lower power consumption than traditionally possible. Although the resulting oscillator phase noise might be degraded due to the losses in the auto-transformer itself and the loading of the auto-transformer on the MEMS resonator, embodiments of the current disclosure may extend the power-phase noise performance trade-off to a region that is otherwise non-feasible with traditional designs.

In this example, the combined tank circuit (auto-transformer 620+MEMS resonator 100) shows three different resonance peaks. The main resonance peak is at the MEMS resonator resonance frequency $f_o$ as indicated at 721 is usually the peak with the highest Q and the highest $R_p$ and therefore the highest oscillator loop gain. Next, there may be a peak at $f_1$ as indicated at 722 resulting from the resonance of the auto-transformer secondary with the capacitance of the MEMS resonator (usually $f_1 < f_o$). There may be another peak at $f_2$ as indicated at 723 resulting from the resonance of the auto-transformer primary with the parasitic capacitance of the oscillator circuit (usually $f_2 > f_o$). The peaks at $f_1$ and $f_2$ are usually much lower C, (about 100×) than the main peak at $f_o$ and usually no special design or additional component is required to prevent spurious oscillation at these frequencies. However, this might change depending on the specific MEMS resonator and auto-transformer used.

In this example, the turns ratio N of autotransformer 620 is approximately 1.3. In this example, $f_0$ is approximately 2.5 GHz and the effective impedance is approximately 1.7 kohms, which is approximately twice as high as the $R_p$ of MEMS resonator 100 by itself (approximately 850 ohms, as shown in FIG. 3B). In this example, $f_1$ is approximately 1.3 GHz at an impedance of approximately 796 ohms and $f_2$ is approximately 6.1 GHz at an impedance of approximately 972 ohms.

Variations in the inductance and characteristics of autotransformer 620 due to process variation or temperature mostly affects the resonance peaks at hand h. The main resonance peak at $f_o$ is less sensitive and is only marginally affected by such variations. Q may be the most sensitive parameter to such variations.

The autotransformer is a short circuit at DC, which kills any possible oscillator gain at DC. This is useful, since the MEMS resonator 100 by itself behaves as a capacitor all the way up to DC. Thus, if the MEMS resonator 100 is directly connected to a cross-coupled differential pair oscillator circuit 501, there is potential for this structure to actually latch at DC. Referring back to FIG. 4, transistor M, M6 and capacitor C1 are required to avoid such latch situation, whereas the auto-transformer/inductor 620 eliminates this concern.

Figure 8:
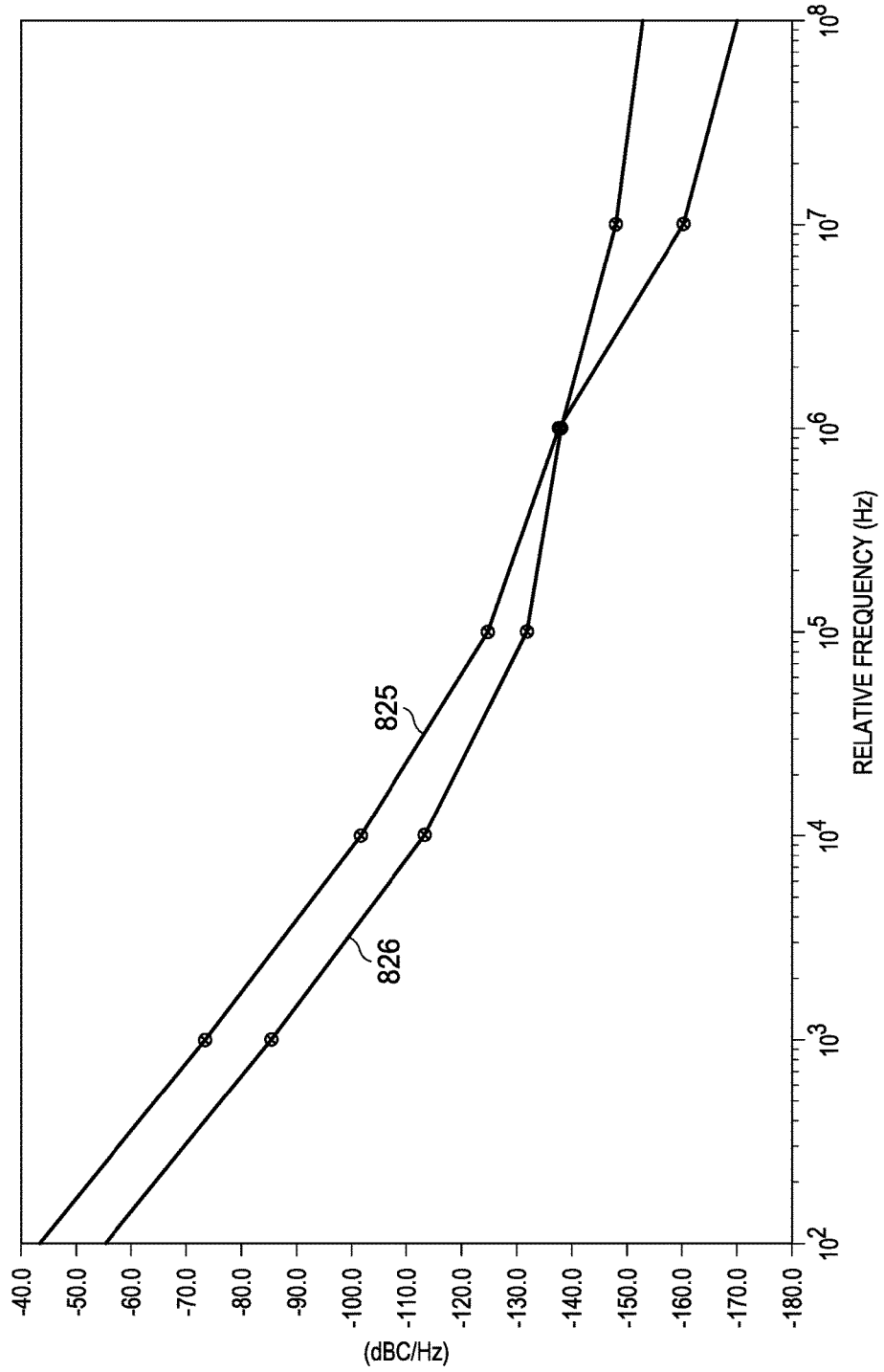
FIG. 8 is a plot illustrating phase noise.

FIG. 8 is a plot illustrating phase noise in dBc/Hz vs relative frequency in Hz of the MEMS resonator 100 and autotransformer 620 of FIG. 6. Similar plots may be produced for the MEMS resonator 100 and transformer 520 of FIG. 5. Plot line 825 represents the phase noise produced by the oscillator circuit 501 of FIG. 6 using MEMS resonator 100 and auto-transformer 620. Plot line 826 represents noise produced by a prior art oscillator such as oscillator 401 of FIG. 4. As can be seen, the phase noise is somewhat higher for oscillator 501 as compared to oscillator 401. However, as discussed above, in many applications the tradeoff of lower power consumption versus a slightly higher phase noise is acceptable.

Figure 9:
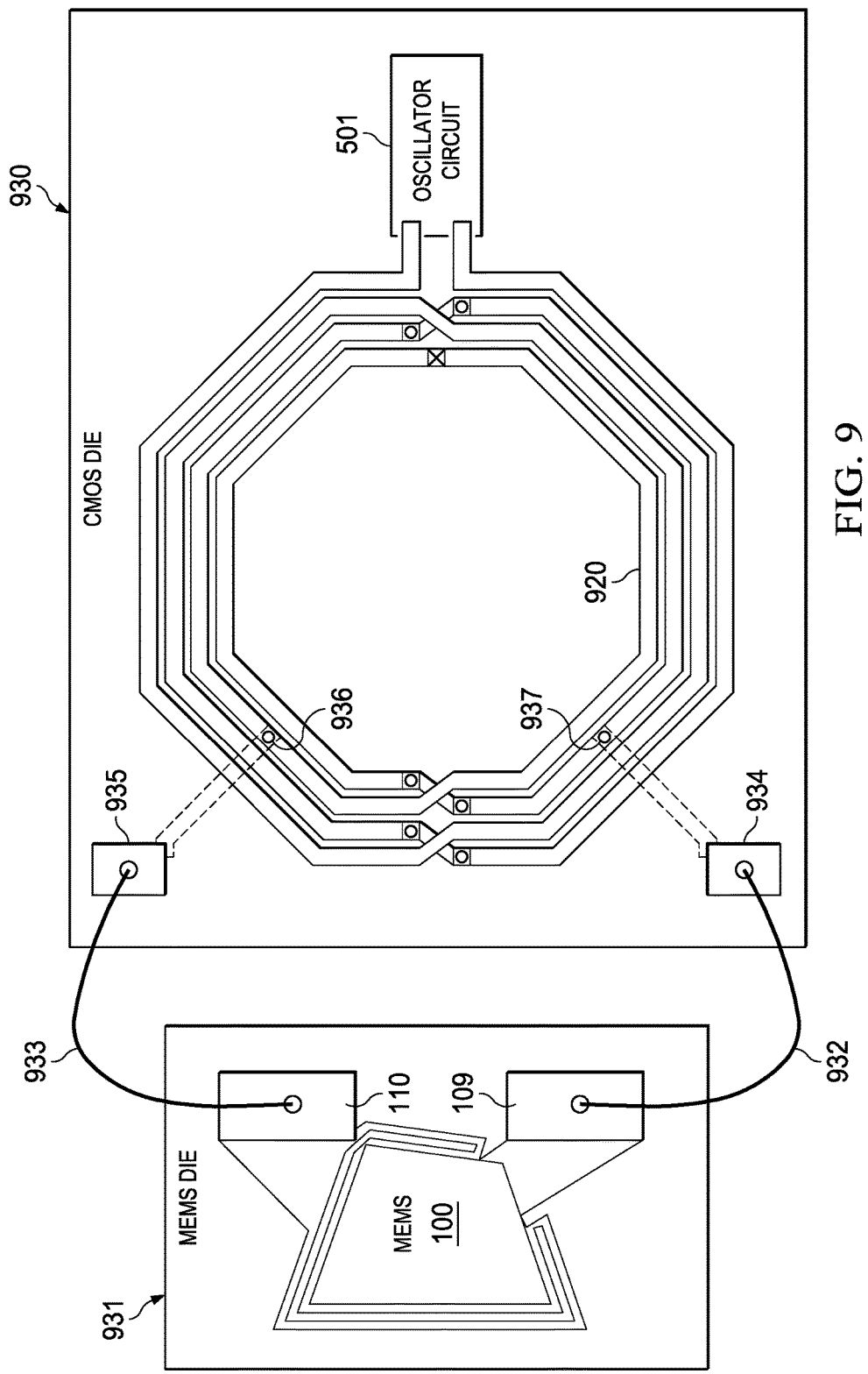
FIGS. 9-10 are block diagrams illustrating alternate embodiments of an auto-transformer.

FIGS. 9 is block diagram illustrating an embodiment of an auto-transformer 920 that may be fabricated on CMOS die 930 during fabrication of the die. CMOS die 930 includes oscillator circuit 501 as shown in more detail in FIG. 6. Auto-transformer 920 may be a simple multi-loop structure that may be formed in the interconnect layers of CMOS die 930 using known or later developed semiconductor fabrication techniques.

In this example, auto-transformer 920 is configured such that MEMS resonator 100 is connected to a center portion of auto-transformer 920 coil at contact points 936, 937. In another embodiment, MEMS resonator 100 may be connected to a different portion of auto-transformer coil 920.

In this example, MEMS resonator 100 may be formed on a separate semiconductor substrate as described in more detail with regard to FIG. 1 to form MEMS die 931. In some embodiments, MEMS die 931 may then be mounted on CMOS die 930. In another embodiment, MEMS die 931 and CMOS die 930 may then be mounted on a third substrate, such as a circuit board or other type of substrate. In either case, bond wires 932, 933 may be used to connect MEMS resonator terminals 109, 110 to bond pads 934, 935 on CMOS die 930 and thereby to auto-transformer 920.

Figure 10:
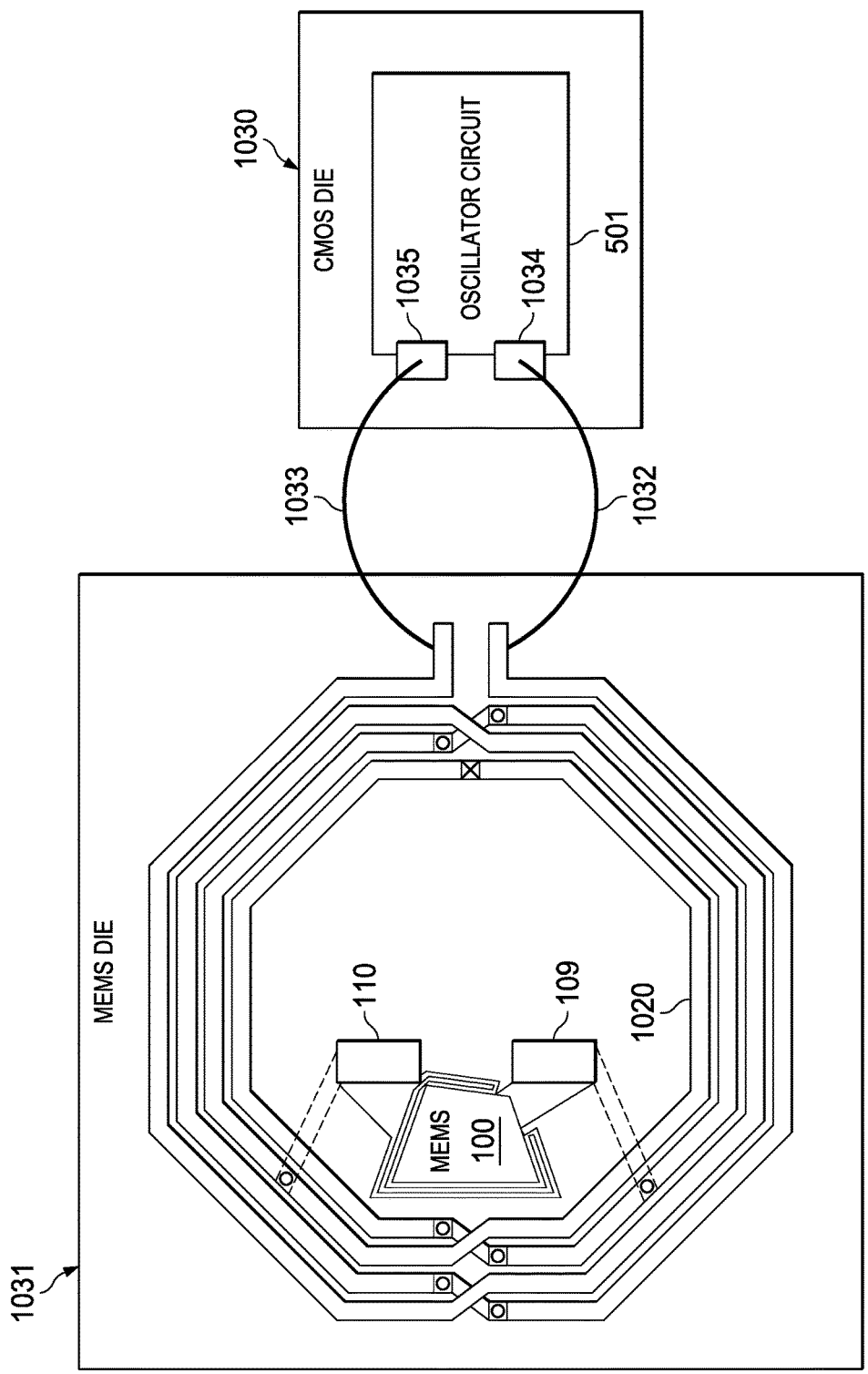

FIGS. 10 is block diagram illustrating an embodiment of an auto-transformer 1020 that may be fabricated on MEMS die 1031 during fabrication of the die. MEMS die 1031 includes MEMS resonator 100 as shown in more detail in FIG. 1.

In this example, MEMS resonator 100 may be formed on a separate semiconductor substrate as described in more detail with regard to FIG. 1 to form MEMS die 1031. Auto-transformer 1020 may be a simple multi-loop structure that may be formed in the interconnect layers of MEMS die 1031 using known or later developed semiconductor fabrication techniques. The secondary portion of auto-transformer 1020 may be directly connected to terminals 109, 110 of MEMS resonator 100.

In some embodiments, MEMS die 1031 may then be mounted on CMOS die 1030. In another embodiment, MEMS die 1031 and CMOS die 1030 may then be mounted on a third substrate, such as a circuit board or other type of substrate. In either case, bond wires 1032, 1033 may be used to connect between bond pads on the primary portion of auto-transformer 1020 to bond, pads 1034, 1035 on CMOS die 1030 and thereby to oscillator circuit 501.

Figure 11:
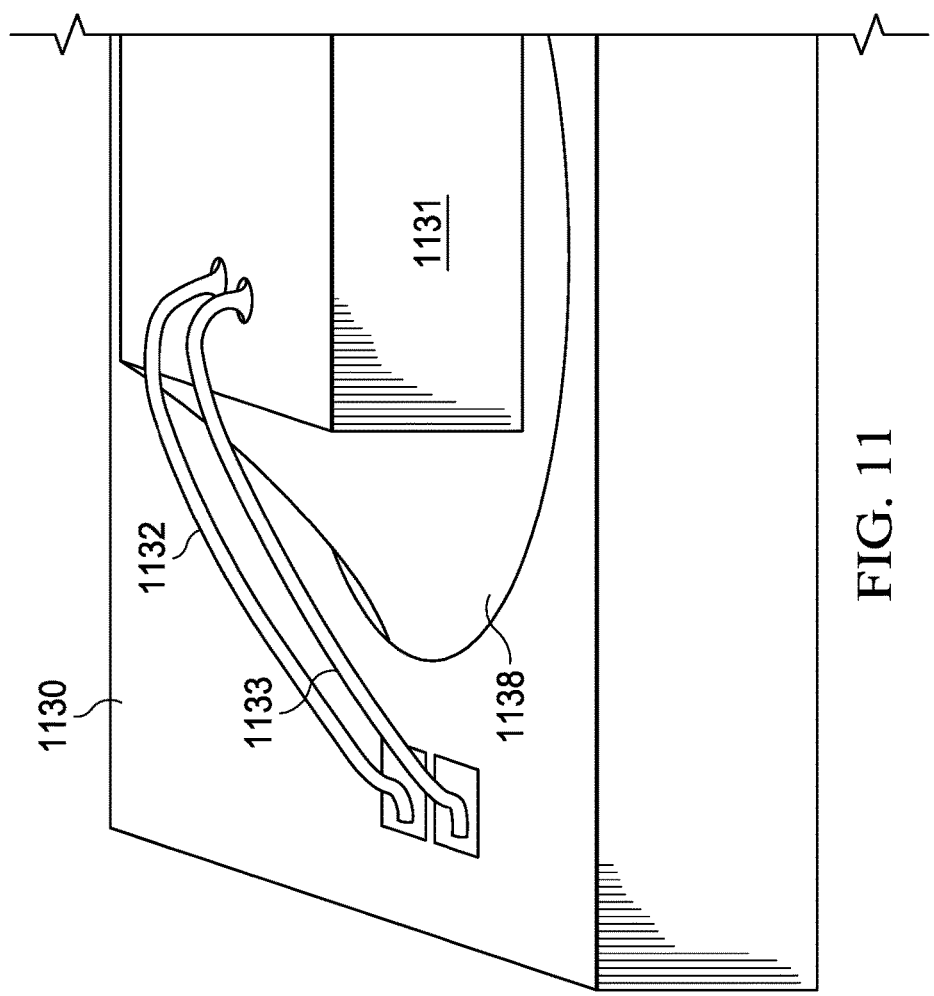
FIG. 11 is an illustration of a MEMS resonator mounted on a CMOS die.

FIG. 11 is an illustration of a MEMS resonator 1131 mounted on a CMOS die 1130. CMOS die 1130 may include oscillator circuit 501 as shown in more detail in FIG. 6. In this example, a MEMS resonator such as MEMS resonator 100 may be formed on a separate semiconductor substrate as described in more detail with regard to FIG. 1 to form MEMS die 1131. In this example, low modulus die attach material 1138 is used to mount MEMS die 1131 on CMOS die 1130.

However, bond wires add variable parasitics and represent a reliability challenge from a packaging point of view. Such parasitics can also be highly sensitive to temperature and voltages variations, which affects the stability of the MEMS resonator. Bond wires may break if packaging is not properly optimized. Bond pads add extra parasitic capacitance to the circuit. Also, the die attach material 1138 for the MEMS die has to be hard enough to allow for wire bonding, which may couple underlying die stress into the MEMS resonator and thereby produce frequency drift. It also significantly limits the possible final product form factor. For example, the end product cannot be a flip-chip package or a wafer chip-scale package (WCSP) and flip chip with such wirebonding.

Connecting a MEMS resonator to an oscillator circuit as well as packaging are usually challenging aspects of such designs. In another example, a MEMS die may be flip-chip mounted to a CMOS die using solder bumps; however, this may introduce stress on the MEMS die. In another example, a MEMS resonator may be fabricated directly onto a CMOS die; however, this may require a special fabrication process. In this case, the MEMS resonator design becomes prohibitively challenging. Stress and temperature compensation may be difficult. Yield might be compromised because any failure on the CMOS or MEMS side is considered a failed product.

As will now be disclosed, inductive coupling may be used between a MEMS resonator and a CMOS die to completely eliminate the wiring/electrical connection between the two, which may significantly simplify the packaging solution and allow for MEMS resonators to be used with package form factors that were not previously feasible.

Figure 12A:
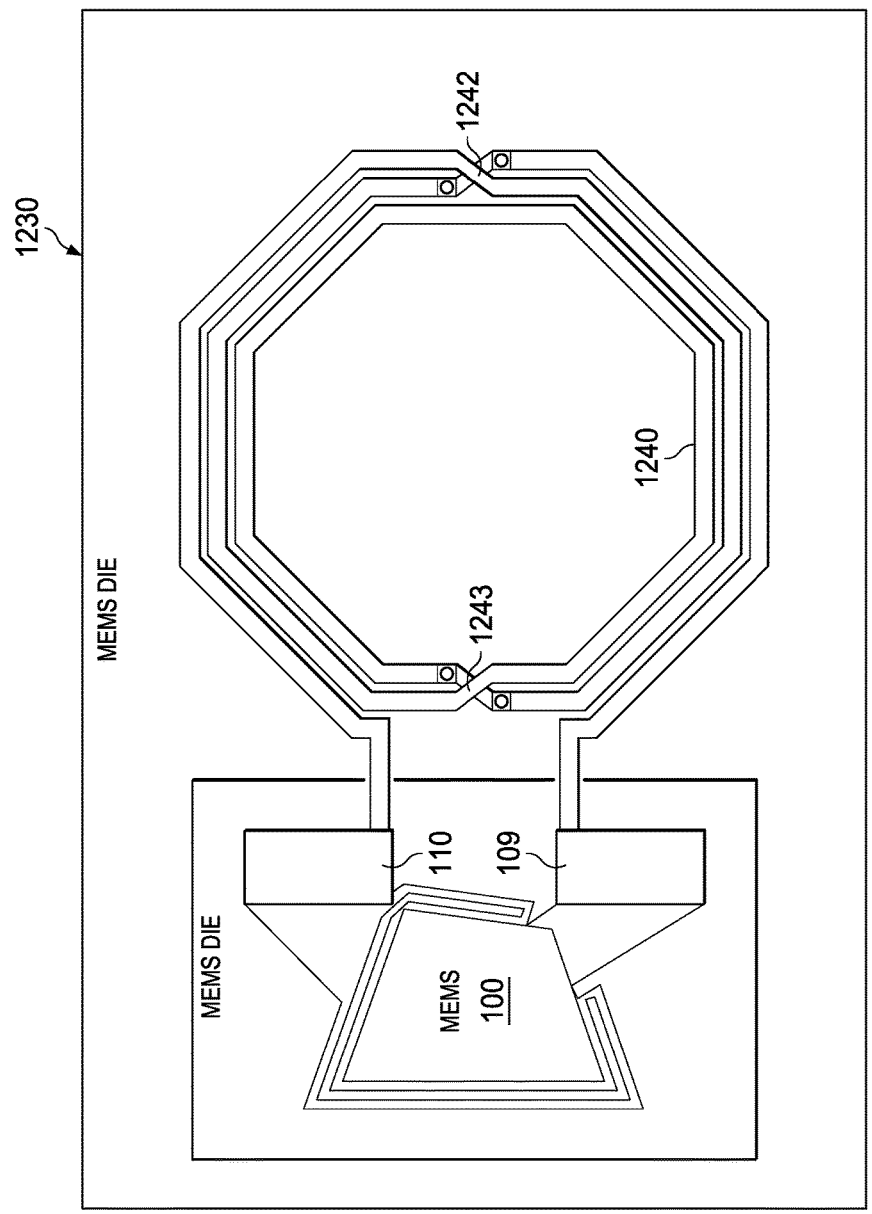
FIGS. 12A-12D illustrate an example of an inductively coupled MEMS resonator.

FIGS. 12A-12D illustrate an example of a MEMS resonator 100 that is inductively coupled to an oscillator circuit 501. MEMS resonator 100 is described in more detail with regard to FIG. 1, while oscillator circuit 501 is described in more detail with regard to FIG. 5. FIG. 12A illustrates how a planar inductor 1240 may be fabricated on the MEMS die 1230 using a known or later developed metallization process for the MEMS die. Planar inductor 1240 may be connected to the MEMS resonator terminals 109, 110, referring again to FIG. 1. Crossovers 1242, 1243 may be easily fabricated using a second metal layer. They may be position as illustrated in FIG. 12A to provide a balanced inductor configuration. In another embodiment, a different planar inductor configuration may be used in which is single crossover is used, for example.

Figure 12B:
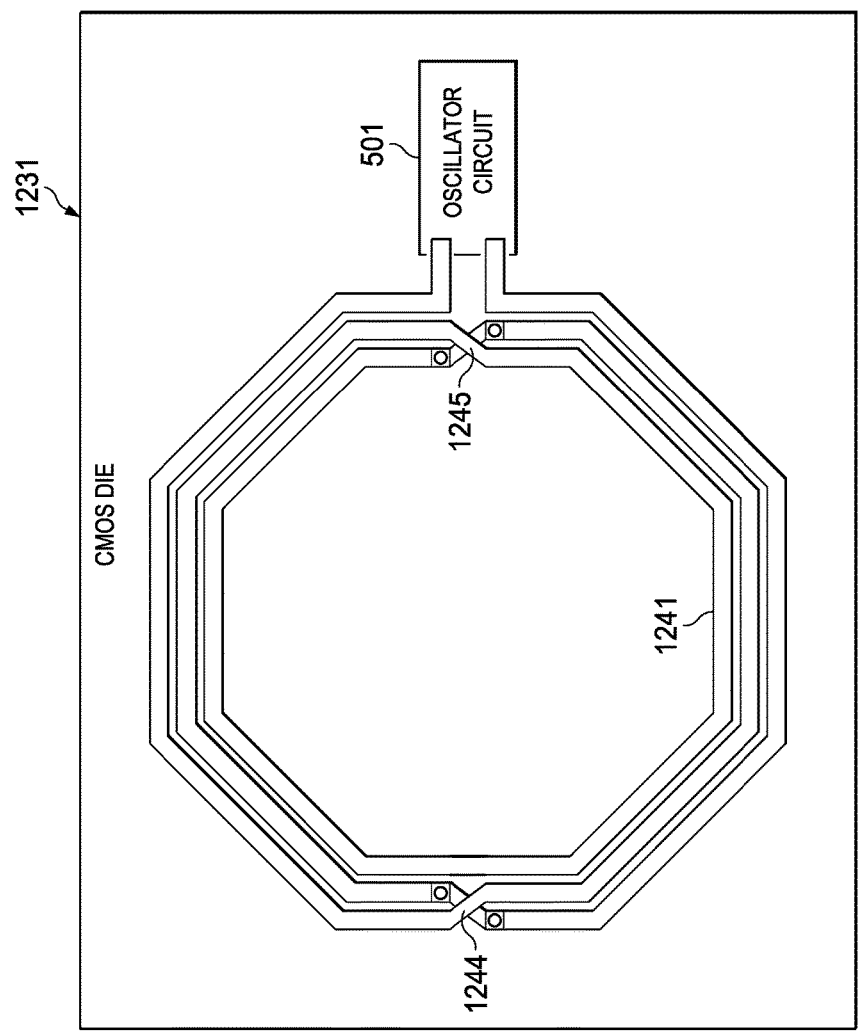

Similarly, a planar inductor 1241 may be fabricated on the CMOS die 1231 using a known or later developed metallization process for the CMOS die, as illustrated in FIG. 12B. Planar inductor 1241 may be connected to the oscillator circuit 501, referring again to FIG. 5. Crossovers 1244, 1245 may be easily fabricated using a second metal layer. They may be position as illustrated in FIG. 12B to provide a balanced inductor configuration. In another embodiment, a different planar inductor configuration may be used in which is single crossover is used, for example.

Figure 12C:
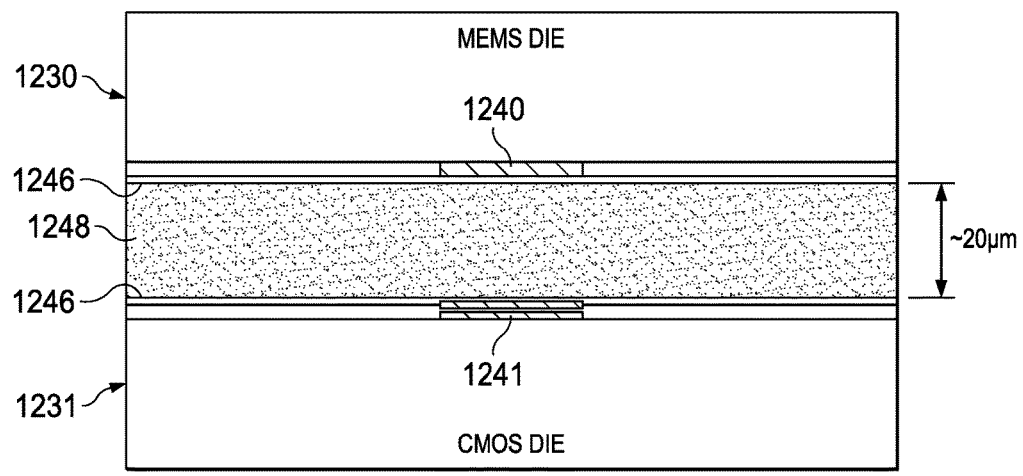

FIG. 12C is a cross sectional view illustrating MEMS die 1230 flipped over and positioned on top of CMOS die 1231 with planar inductor 1240 in alignment with planar inductor 1241 and in close proximity. A passivation layer 1246 may be applied to the top surface of MEMS die 1230 and CMOS die 1231. A thin layer of soft die attach material 1248 may be used to secure MEMS die 1230 to CMOS die 1231. In this example, die attach material 1248 is approximately 20 um in thickness so that planar inductor 1240 may be in close proximity to planar inductor 1241. Because there are no wire bonds, a much softer die attach material may be used in this example and may provide better stress relief for the MEMS die.

In this manner, a transformer is formed that couples MEMS resonator 100 to oscillator circuit 501 in a configuration that is similar to the configuration of FIG. 5 with N=1, since in this example, planar inductor 1240 and 1241 both have three turns.

Figure 12D:
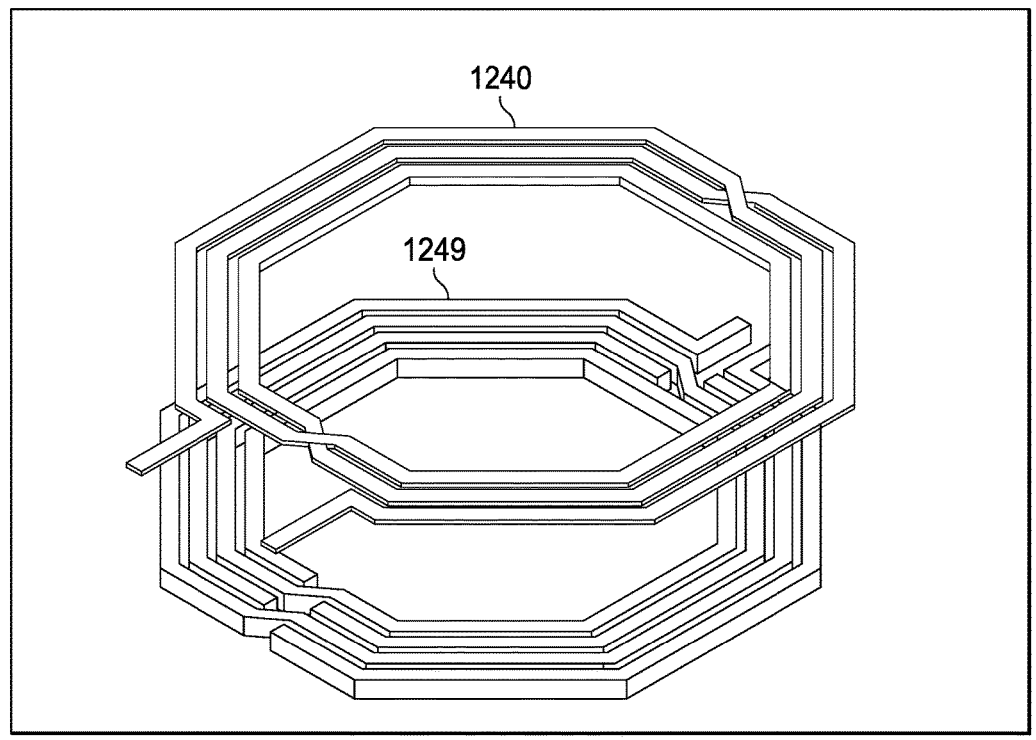

FIG. 12D illustrates another embodiment in which a planar inductor 1249 that has four turns may be fabricated on CMOS die 1231 in place of planar inductor 1241. In this case, a transformer that has a turns ratio of 1.33:1 may be formed, where N=1.33. In this case, the effective impedance of MEMS resonator is increased and allows lower power operation of oscillator circuit 501, as described in more detail above.

In an example design, the planar inductor 1240 on MEMS die 1230 shown in FIG. 12A may have three turns with an outer radius of 220 μm, with each loop having a width of 15 μm and a loop to loop separation of 10 μm. The metal layer may include 1.1 μm thick aluminum and 1.6 μm copper. The planar inductor 1249 on CMOS die 1231 shown in FIG. 12D may have four turns with an outer radius of 200 μm, with each loop having a width of 8 pm and a loop to loop separation of 4 µm. The metal layer may include 1 µm thick aluminum, for example. In this example, die attach material 1248 is approximately 20 um in thickness so that planar inductor 1240 may be in close proximity to planar inductor 1241. Other designs may use thicker metals and/or thinner die attach to achieve a higher Q.

Figure 13:
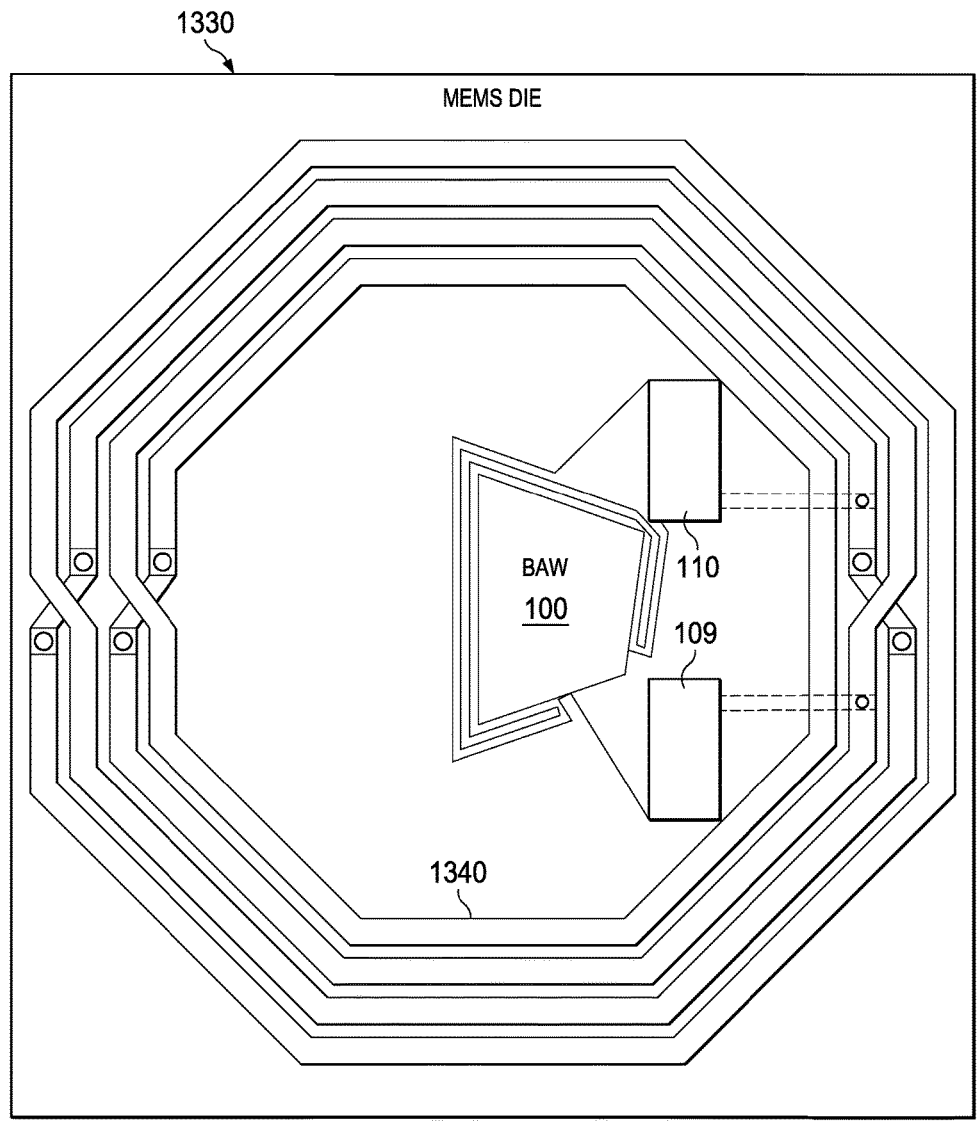
FIG. 13 illustrates an alternative embodiment of a coupling coil.

FIG. 13 illustrates an alternative embodiment of a MEMS die 1330. In this example, a planar inductor 1340 is positioned around MEMS resonator 100 in order to reduce die area, as compared to the configuration of FIG. 12A. In a similar manner, a planar inductor may be positioned around oscillator circuit 501 to save die area on the oscillator die.

Figure 14:
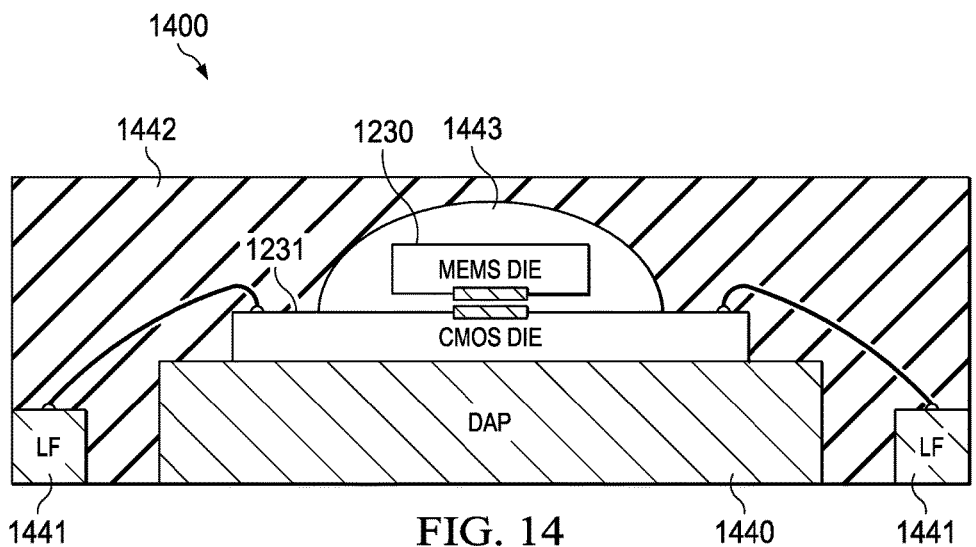
FIGS. 14-18 are cross sectional views illustrating alternative embodiments of an inductively coupled resonator.

FIG. 14 is a cross sectional view illustrating an embodiment of an inductively coupled resonator in an encapsulated integrated circuit (IC) package 1400. In this example, a CMOS die 1231 as shown in FIG. 12B is mounted on a die attach pad (DAP) of a leadframe using a known or later developed die attach process. Leadframe contacts 1441 may surround the periphery of IC package 1400. Bond wires 1442 may be used to connect bond pads on CMOS die 1231 to leadframe contacts 1441, using known or later developed wire bonding techniques.

Some integrated circuits have no-lead packages such as quad-flat no-leads (QFN) and dual-flat no-leads (DEN) devices that physically and electrically couple integrated circuits to printed circuit boards. Flat no-lead devices, also known as micro leadframe (MLF) and small outline no-leads (SON) devices, are based on a surface-mount technology that connects integrated circuits to the surfaces of printed circuit boards without through-holes in the printed circuit boards. Perimeter lands 1441 on the package provide electrical coupling to the printed circuit board. In this example, IC package 1400 is a quad-flat no-leads (QFN) package; however, in other embodiments various known or later developed packaging configurations, such as DEN, MLF, SON, dual inline packages (DIP), etc, may be fabricated using the techniques disclosed herein to form an encapsulated package that includes a MEMS resonator inductively coupled to an oscillator circuit.

In this example, MEMS die 1230 as shown in FIG. 12A is flipped over and positioned on CMOS die 1231 such that planar inductors on each die are in alignment and in close proximity, as illustrated in more detail with regards to FIG. 12C. A blob of protective material 1443 may be placed over MEMS resonator to isolate it from the encapsulation material and provide stress relief.

The completed assembly may then be encapsulated using an encapsulation material 1442, such as epoxy resin or other known or later developed encapsulation materials. An entire lead frame strip may then be covered with a layer of mold compound to encapsulate the ICs. The leadframe strip may then be singulated into individual packaged ICs by cutting along cut lines, for example.

Figure 15:
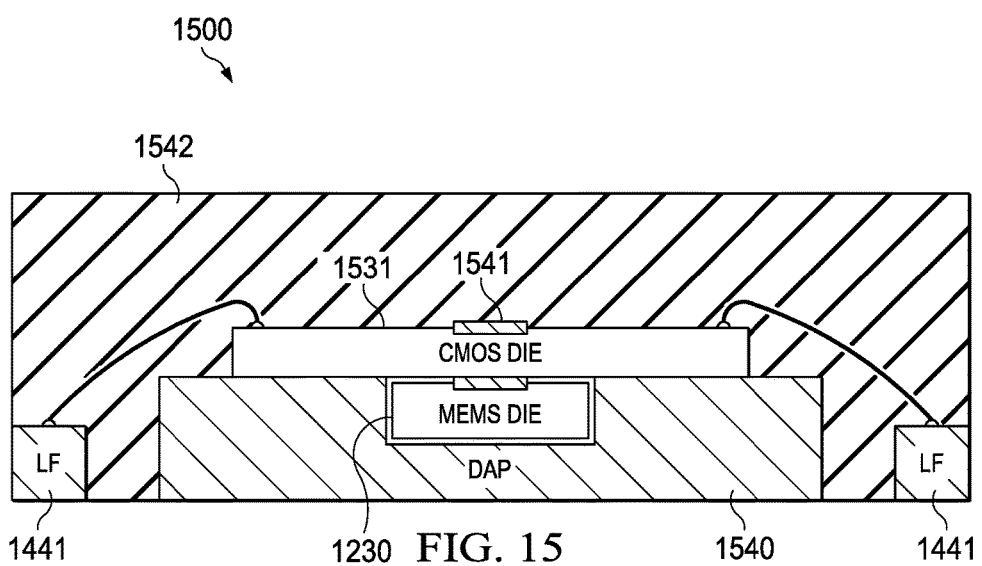

FIG. 15 is a cross sectional view illustrating another embodiment of an inductively coupled resonator in an encapsulated integrated circuit (IC) package 1500. In this example, a CMOS die 1531, which may be similar to CMOS die 1231 as shown in FIG. 12B, is mounted on a die attach pad (DAP) of a leadframe using a known or later developed die attach process. Leadframe contacts 1441 may surround the periphery of IC package 1400. Bond wires 1442 may be used to connect bond pads on CMOS die 1530 to leadframe contacts 1441, using known or later developed wire bonding techniques.

In this example, MEMS die 1230 as shown in FIG. 12A is placed in a groove within DAP 1540. In this case, MEMS die 1230 may be left "floating" and not physically attached to CMOS die 1531 in order to reduce stress on MEMS die 1230. Alternatively, a thin layer of soft die attach material may be used to secure MEMS die 1230 to DAP 1540 and/or to CMOS die 1531. CMOS die 1531 may be thinned down for better coupling between a planar inductor in MEMS die 1230 and planar inductor 1541 on CMOS die 1531.

Figure 16:
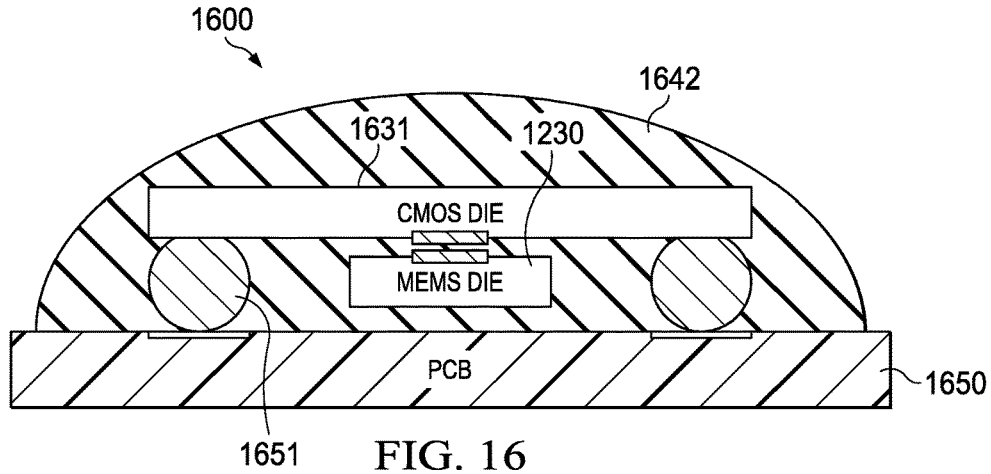

FIG. 16 is a cross sectional view illustrating another embodiment of an inductively coupled resonator in a flip-chip or WCSP package configuration 1600. In this example, a CMOS die 1631, which may be similar to CMOS die 1231 as shown in FIG. 12B, is mounted on a printed circuit board (PCB) 1650 with solder bumps 1651 using a known or later developed flip-chip process. An encapsulation material blob 1642 may be placed over CMOS die 1631 in some embodiments.

In this example, MEMS die 1230 may be attached to CMOS die 1631 using a thin layer of soft die attach material, such as die attach material 1248 as shown in FIG. 12C.

Figure 17:
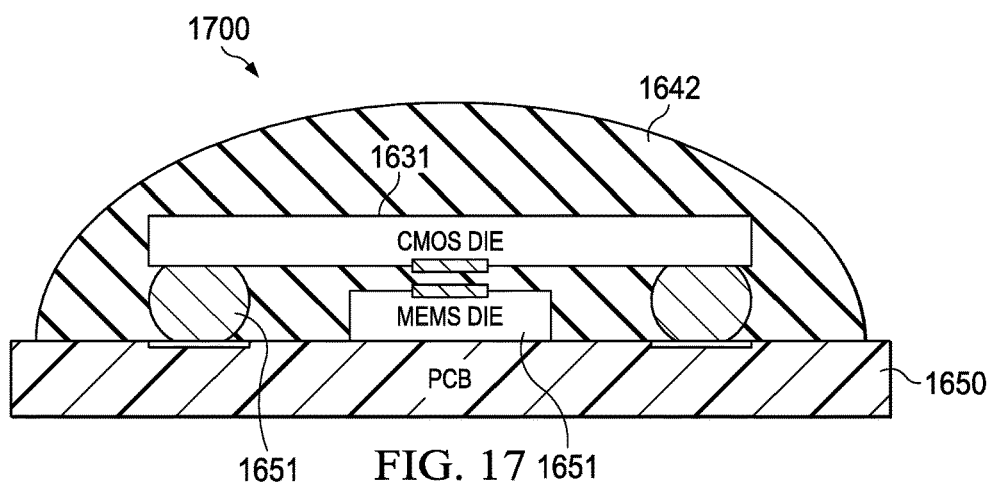

FIG. 17 is a cross sectional view illustrating another embodiment of an inductively coupled resonator in a flip-chip or WCSP package configuration 1700. In this example, a CMOS die 1631, which may be similar to CMOS die 1231 as shown in FIG. 12B, is mounted on a printed circuit board (PCB) 1650 with solder bumps 1651 using a known or later developed flip-chip process. An encapsulation material blob 1642 may be placed over CMOS die 1631 in some embodiments.

In this example, MEMS die 1230 may be attached to PCB 1650 using a thin layer of soft die attach material, such as die attach material 1248 as shown in FIG. 12C. In this manner, MEMS die 1230 is not in contact with CMOS die 1631 and die to die stress is thereby eliminated.

Figure 18:
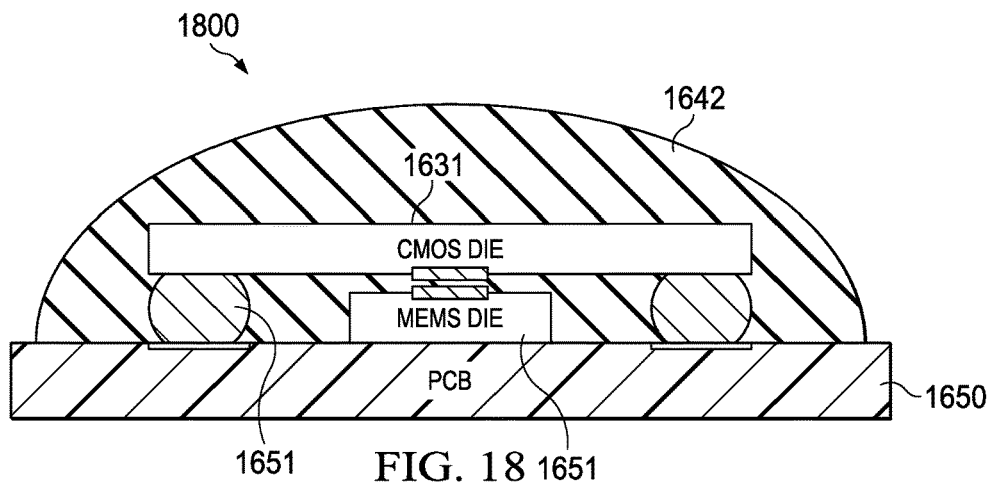

FIG. 18 is a cross sectional view illustrating another embodiment of an inductively coupled resonator in a flip-chip or WCSP package configuration 1800. In this example, a CMOS die 1631, which may be similar to CMOS die 1231 as shown in FIG. 12B, is mounted on a printed circuit board (PCB) 1650 with solder bumps 1651 using a known or later developed flip-chip process. An encapsulation material blob 1642 may be placed over CMOS die 1631 in some embodiments.

In this example, MEMS die 1230 may be attached to PCB 1650 using a thin layer of soft die attach material, such as die attach material 1248 as shown in FIG. 12C. CMOS die 1631 may be resting on MEMS die 1230 and/or attached to MEMS die 1230 using a layer of soft die attach material 1248.

Figure 19:
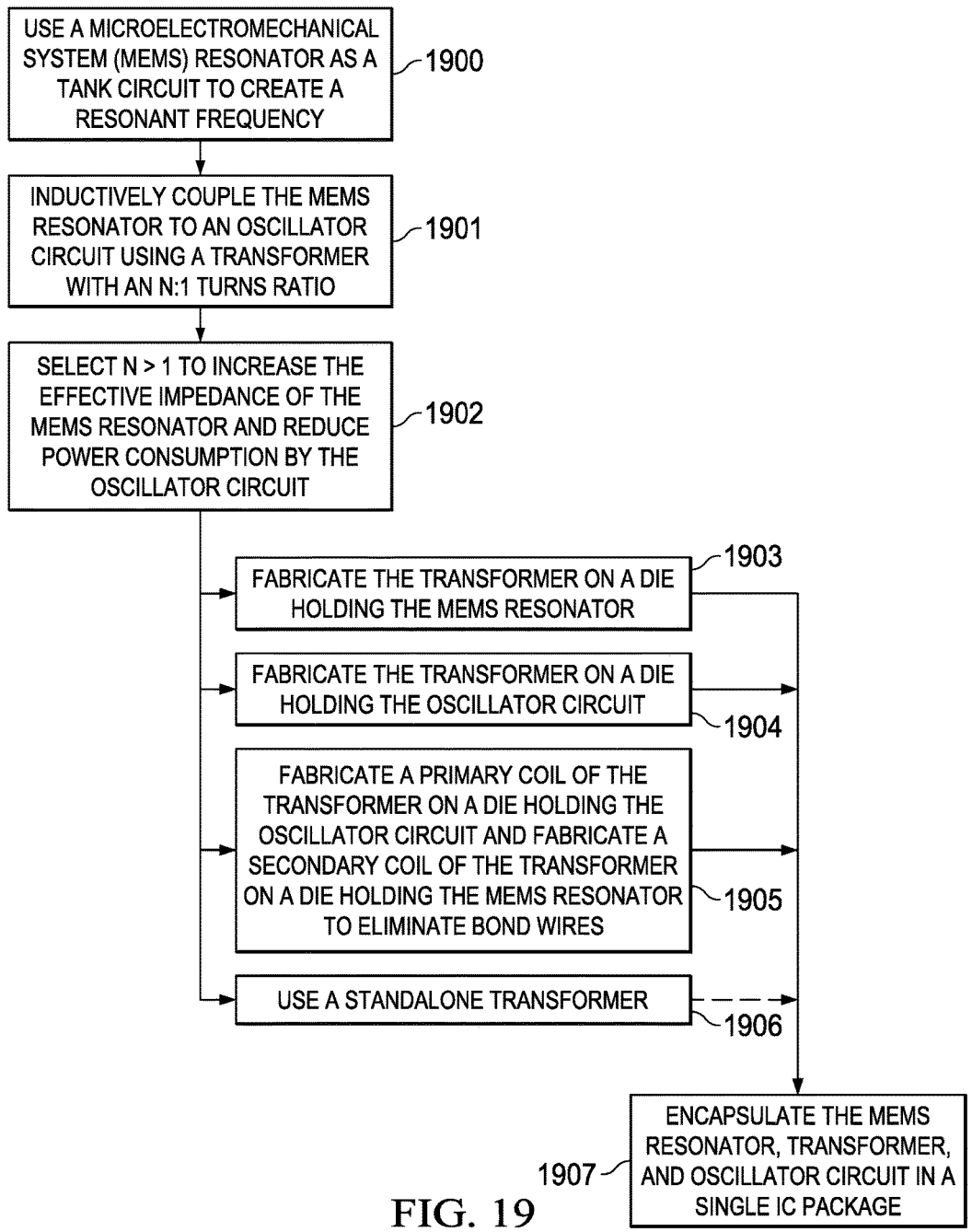
FIG. 19 is a flow chart illustrating operation of an example MEMS oscillator.

FIG. 19 is a flow chart illustrating operation of an example oscillator that uses a MEMS resonator, such as MEMS resonator device 100 as illustrated in FIG. 1. A MEMS resonator may be used as a tank circuit to create a resonant frequency, as indicated at box 1900, and as described in more detail above.

The MEMS resonator may be inductively coupled to an oscillator circuit using a transformer with a turns ratio of N:1, as indicated at box 1902.

In some embodiments, N may be selected to be greater than one, as indicated at box 1902. As described in more detail above with regard to FIG. 7A, the effective impedance of the MEMS resonator will be increased when N>1. Increasing the effective impedance of the MEMS resonator reduces the current required to operate the oscillator circuit.

In some embodiments, the transformer may be fabricated on a die holding the MEMS resonator as indicated at box 1903 and described in more detail with regards to FIG. 10.

In some embodiments, the transformer may be an autotransformer as illustrated in FIG. 6 and FIG. 10.

In some embodiments, the transformer may be fabricated on a die holding the oscillator circuit as indicated at box 1904 and described in more detail with regards to FIG. 9. In some embodiments, the transformer may be an auto-transformer as illustrated in FIG. 6 and FIG. 9.

In some embodiments as indicated at box 1905, a primary coil of the transformer may be fabricated on a die holding the oscillator circuit as shown in more detail in FIG. 12B, and a secondary coil of the transformer may be fabricated on a die holding the MEMS resonator as shown in more detail in FIG. 12A. In this case, the turns ratio may be selected to be 1:1, or may be selected to be N:1, where N>1 to thereby increase the effective resistance of the MEMS resonator and reduce current required by the oscillator circuit.

In some embodiments, the transformer may be implemented as a stand-alone component as indicated at box 2906.

In any case, the oscillator circuit, MEMS resonator, and transformer may be encapsulated in a single IC package as indicated at box 1907 and described in more detail with regard to FIGS. 14-18.

In this manner, a low-phase noise MEMS-based oscillators with significantly lower power consumption than fundamentally possible with the MEMS resonator by itself may be implemented. The transformer coupling techniques disclosed herein extend the range of phase-noise/power consumption trade-off.

The transformer coupling techniques disclosed herein reduce the need for extensive MEMS process and MEMS device optimization, which may be a complex and resource intensive process.

Using auto-transformers that can be integrated on the MEMS die or the CMOS die does not compromise the integration potential of the MEMS resonator and does not significantly penalize the system in terms of its size.

Furthermore, in the case of inductive coupling as disclosed in FIG. 12C and elsewhere, an oscillator or a filter on a CMOS circuit may be connected to an on-CMOS die inductor without any pads or ESD structures as shown in FIG. 12B, which greatly simplifies the circuit design and reduces parasitic capacitance and inductance. Core oscillator circuitry is no longer connected to external pads.

The techniques disclosed herein eliminate wirebonding and may significantly simplify packaging and provide better reliability by eliminating bond wire breakage. Elimination of bond wires eliminates the parasitic inductance and the variability associated with bond wires. A much softer die attach material may be used when wirebonding is not used, which may help with stress-relief for the MEMS die.

The techniques disclosed herein allow new package form factors, such as flip-chip package and WCSP packaging that were not previously feasible with wirebonding.

Other Embodiments

While the disclosure has been described with reference to illustrative embodiments, this description is not intended to be construed in a limiting sense. Various other embodiments of the disclosure will be apparent to persons skilled in the art upon reference to this description. For example, while only an oscillator circuit was described herein, a CMOS die may contain many other circuits in addition to an oscillator circuit, such as one or more processing cores and associated memory circuits, amplifiers, filters, interface circuits for sending or receiving data from an external node, etc.

While a solid MEMS resonator 100 as shown in FIG. 1 was described herein, other embodiments of the techniques disclosed herein may use other types or configurations of MEMS resonators that are currently known or later developed, such as: silicon-germanium devices, aluminum nitride devices, quartz devices, polycrystalline diamond devices, etc.

Planar inductors may be formed with thinner or thicker metal layers, different loop size, different loop to loop spacing, etc. than described herein.

While oscillator circuits were described herein, the techniques disclosed herein may be used to implement resonant filter circuits using MEMS resonators.

An embodiment may use a single MEMS resonator or identical MEMS resonators in series for oscillator/filter applications.

Other embodiments may use a combination of parallel and series MEMS resonators with small mismatch in their resonance frequency to create arbitrary filter structures.

Inductive coupling may be applicable to other resonator and filter configurations. For example, a MEMS resonator filter may be constructed that is inductively coupled the output of a power amplifier for BLE (Bluetooth Low Energy) applications.

Figure 20:
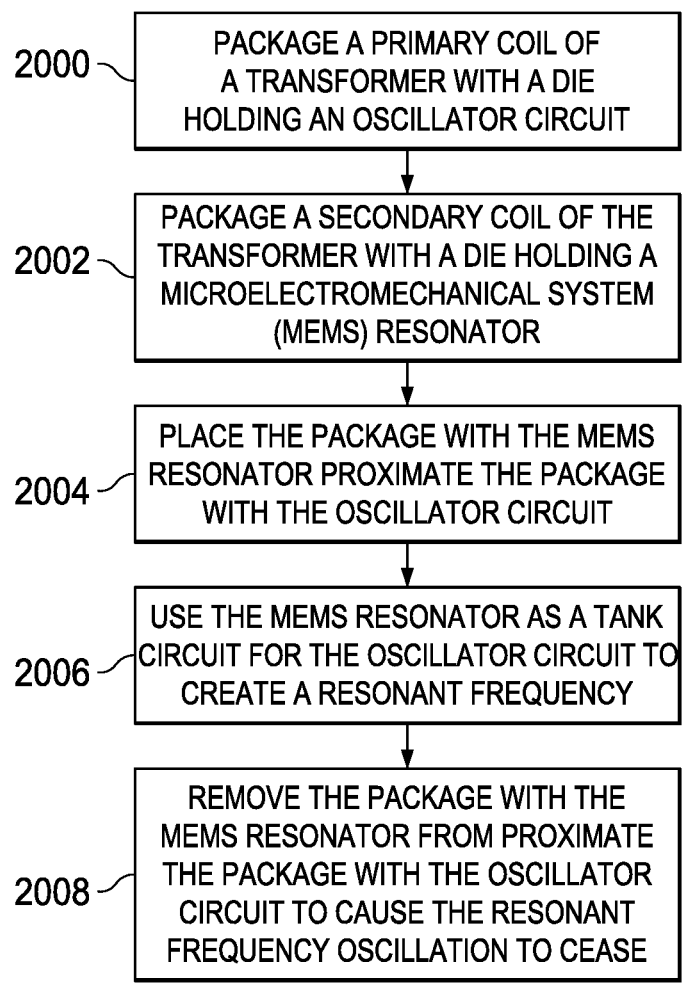
FIG. 20 is a flow chart illustrating operation of an example MEMS oscillator with a removable MEMS resonator.

FIG. 20 is a flow chart illustrating operation of an example MEMS oscillator with a removable MEMS resonator. In this example, an oscillator circuit may be packaged with a primary coil of a transformer as indicated at 2000, as described in more detail above, such as illustrated in FIG. 12B. The packaged oscillator may be used as part of a security system, for example.

A MEMS resonator may be packaged with a secondary coil of the transformer as indicated at 2002, as described in more detail above, such as illustrated in FIG. 12A. The MEMS resonator may be included in an identification badge, or other security system access device, for example.

The security system access device with the MEMS resonator may then be placed proximate the oscillator circuit in the security system as indicated at 2004. For example, a security badge containing the MEMS resonator may be inserted in a slot or placed on pad in a manner that the secondary coil will be in dose physical proximity to the primary coil.

The MEMS resonator may then be inductively coupled to the oscillator using the primary coil on the first device positioned in proximity to the secondary coil on the second device. The MEMS resonator may then be used as a tank circuit of the oscillator to produce a resonant frequency of operation as indicated at 2006. In this manner, the security badge may be validated, for example.

The package with the MEMS resonator may then be removed from proximate the oscillator to cause the resonant frequency oscillation to cease, as indicated at 2008.

When the MEMS resonator is removed, the oscillator still has an inductor in the form of the primary coil and thereby forms a tank circuit (like a VCO). Depending on how the tank circuit is designed, the oscillator may then oscillate at a different oscillation frequency, or might not oscillate at all. However, the circuit may be designed to detect if the MEMS resonator is existing or not.

This may be useful for security purposes, such as wireless physical dongles for car keys, house keys, etc., identification badges, package labels, etc.

Certain terms are used throughout the description and the claims to refer to particular system components. As one skilled in the art will appreciate, components in digital systems may be referred to by different names and/or may be combined in ways not shown herein without departing from the described functionality. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" and derivatives thereof are intended to mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

Although method steps may be presented and described herein in a sequential fashion, one or more of the steps shown and described may be omitted, repeated, performed concurrently, and/or performed in a different order than the order shown in the figures and/or described herein. Accordingly, embodiments of the disclosure should not be considered limited to the specific ordering of steps shown in the figures and/or described herein.

It is therefore contemplated that the appended claims will cover any such modifications of the embodiments as fall within the true scope and spirit of the disclosure.

What is claimed is:

1. An integrated circuit (IC) comprising:
   a first die having a first coil fabricated on a top surface of the first die, and a microelectromechanical (MEMS) resonator fabricated on the first die and coupled to the first coil;
   a second die having a second coil fabricated on a top surface of the second die, and an electronic circuit with tank circuit terminals fabricated on the second die and coupled to the second coil; and
   wherein the second die is positioned adjacent the first die such that the first coil is operable to electromagnetically couple to the second coil.

2. The IC of claim 1, wherein the first coil has m turns, the second coil has n turns, and n is greater than m.

3. The IC of claim 1, wherein the first coil is a planer coil formed by one or more metal layers on the top surface of the first die, and the second coil is a planer coil formed by one or more metal layers on the top surface of the second die.

4. The IC of claim 1, wherein the first coil is a planer coil formed by one or more metal layers on the top surface of the first die, wherein the MEMS resonator is surrounded by the first coil.

5. The IC of claim 1, wherein the first die and the second die together are surrounded by an encapsulation material.

6. The IC of claim 5, further including:
   a die attach pad and lead frame contacts, wherein the second die is attached to the die attach pad; and
   a blob of protective material surrounds the first die separating the encapsulation material from the first die.

7. The IC of claim 5, further including:
   a die attach pad and lead frame contacts, wherein the second die is attached to the die attach pad; and
   wherein the first die is positioned in a cavity in the die attach pad such that the first die is positioned between the second die and the die attach pad.

8. The IC of claim 1, wherein the first die is flipped and mounted on the second die such that the top surface of the first die is adjacent to the top surface of the second die.

9. The IC of claim 8, further comprising a soft die attach material located between the top surface of the first die and the top surface of the second die.

10. The IC of claim 9, wherein the soft die attach material has a thickness of approximately 20 μm.

11. The IC of claim 1, further comprising solder bumps placed on the second die to form a flip-chip die.

12. The IC of claim 11, further comprising a substrate, wherein the first die is attached to the substrate and the solder bumps of the second die are attached to the substrate such the second die is positioned above the first die.

13. The IC of claim 12, further comprising encapsulation material placed on the substrate to surround the first die and the second die.

14. The IC of claim 1, wherein the electronic circuit is an oscillator circuit or a filter circuit.

15. A method for operating an oscillator, the method comprising:
   using a microelectromechanical (MEMS) resonator as a tank circuit of the oscillator to produce a resonant frequency of operation, wherein the MEMS resonator is on a first substrate and the oscillator is on a second substrate separated from the first substrate; and
   inductively coupling the MEMS resonator to the oscillator using a first coil on the first substrate positioned in proximity to a second coil on the second substrate.

16. The method of claim 15, wherein the first coil has m turns, the second coil has n turns, and n is greater than m.

17. The method of claim 15, further comprising:
   fabricating the oscillator circuit on the first substrate; and
   fabricating the second coil as a planar inductor in one or more metallic layers on a surface of the first substrate.

18. The method of claim 15, further comprising:
   fabricating the. MEMS resonator on the second substrate; and
   fabricating the transformer as a planar inductor in one or more metallic layers on a surface of the second substrate.

19. A method for operating an oscillator, the method comprising:
   placing a first device adjacent to a second device, wherein the first device includes a microelectromechanical (MEMS) resonator connected to a first coil, and the second device includes an oscillator circuit coupled to a second coil;
   inductively coupling the MEMS resonator to the oscillator using the first coil on the first device positioned in proximity to the second coil on the second device; and
   using MEMS resonator as a tank circuit of the oscillator to produce a resonant frequency of operation.

20. The method of claim 19, further comprising removing the first device from adjacent the second device to cause the oscillator to cease oscillation.

* * * * *